US011183429B2

(12) United States Patent
Kang et al.

(10) Patent No.: US 11,183,429 B2
(45) Date of Patent: Nov. 23, 2021

(54) METHOD OF MANUFACTURING A SEMICONDUCTOR DEVICE INCLUDING FORMING A GATE INSULATING MATERIAL LAYER ON A PROTECTION LAYER AND REMOVING THE GATE INSULATION MATERIAL LAYER AND THE PROTECTION LAYER ON THE FIRST REGION

(71) Applicant: Samsung Electronics Co., Ltd., Suwon-si (KR)

(72) Inventors: Sung Min Kang, Suwon-si (KR); Kyung Min Kim, Suwon-si (KR); Young Mok Kim, Suwon-si (KR); Min Hee Uh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 62 days.

(21) Appl. No.: 16/709,125

(22) Filed: Dec. 10, 2019

(65) Prior Publication Data

US 2020/0312727 A1 Oct. 1, 2020

(30) Foreign Application Priority Data

Mar. 25, 2019 (KR) .................. 10-2019-0033293
May 31, 2019 (KR) .................. 10-2019-0064342

(51) Int. Cl.
*H01L 21/8238* (2006.01)
*H01L 27/12* (2006.01)
(Continued)

(52) U.S. Cl.
CPC ........... *H01L 21/823807* (2013.01); *H01L 21/82385* (2013.01); *H01L 21/823462* (2013.01);
(Continued)

(58) Field of Classification Search
CPC ..... H01L 21/823462; H01L 21/823807; H01L 21/82385; H01L 27/0922; H01L 27/1207
See application file for complete search history.

(56) References Cited

U.S. PATENT DOCUMENTS 6,709,931 B2   3/2004 Kim
6,897,095 B1 * 5/2005 Adetutu ........ H01L 21/823857
                                                     257/493

(Continued)

FOREIGN PATENT DOCUMENTS

JP          2001-308198 A     11/2001
KR     10-2011-0048166 A      5/2011

*Primary Examiner* — Anh D Mai
(74) *Attorney, Agent, or Firm* — Harness, Dickey & Pierce, P.L.C.

(57) ABSTRACT

A method of manufacturing a semiconductor device includes providing a substrate including a first region and a second region, forming a first channel layer in the first region of the substrate, forming an isolation region in the substrate to electrically isolate a portion of the first region from a portion of the second region, etching an upper surface of the second region of the substrate, forming a protection layer covering the first channel layer in the first region of the substrate and the second region of the substrate, removing the protection layer on the second region of the substrate, forming a gate insulation material layer on the protection layer and on the second region of the substrate, and removing the gate insulation material layer and the protection layer on the first region of the substrate.

17 Claims, 26 Drawing Sheets

(51) Int. Cl.
  *H01L 21/84*      (2006.01)
  *H01L 27/092*    (2006.01)
  *H01L 21/8234*  (2006.01)

(52) U.S. Cl.
  CPC ...... *H01L 21/823878* (2013.01); *H01L 21/84* (2013.01); *H01L 27/092* (2013.01); *H01L 27/1207* (2013.01)

(56) References Cited

U.S. PATENT DOCUMENTS

| | | |
|---|---|---|
| 7,241,662 B2 | 7/2007 | Wolstenholme et al. |
| 8,546,268 B2 | 10/2013 | Entalai et al. |
| 9,023,713 B2 | 5/2015 | Illgen et al. |
| 2003/0227013 A1* | 12/2003 | Currie ................. H01L 27/0922 257/19 |
| 2005/0282329 A1* | 12/2005 | Li .................... H01L 21/823857 438/216 |
| 2006/0084220 A1* | 4/2006 | Lim ................ H01L 21/823807 438/216 |
| 2006/0148185 A1 | 7/2006 | Shin |
| 2007/0145481 A1* | 6/2007 | Tilke .................... H01L 27/092 257/347 |
| 2010/0197128 A1* | 8/2010 | Schaeffer ........ H01L 21/823807 438/591 |
| 2015/0214121 A1 | 7/2015 | Illgen et al. |

* cited by examiner ial Layer on a Protection Layer and Removing the Gate Insulation Material Layer and the Protection Layer on the First Region

CROSS-REFERENCE TO RELATED APPLICATION

This application claims priority under 35 U.S.C. § 119 to both Korean Patent Application No. 10-2019-0033293, filed on Mar. 25, 2019 and Korean Patent Application No. 10-2019-0064342, filed on May 31, 2019, in the Korean Intellectual Property Office, the disclosures of each of which are hereby incorporated by reference in their entirety.

TECHNICAL FIELD

Example embodiments of the present disclosure relate to semiconductor devices and methods of manufacturing semiconductor devices.

DISCUSSION OF RELATED ART

With reduction of sizes, low voltage semiconductor devices have been developed. However, the semiconductor devices may include a voltage boosting circuit or may have a power supply voltage of 12V in itself as used for a vehicle. Thus, the semiconductor devices may include low voltage transistors and high voltage transistors.

In a process of forming the low voltage transistors and high voltage transistors in semiconductor devices, silicon germanium and silicon used to form a channel may be oxidized, or a germanium may be precipitated.

SUMMARY

According to some example embodiments of the inventive concepts, a method of manufacturing a semiconductor device may include forming a first channel layer in a first region of a substrate, the substrate including the first region and a second region, forming an isolation region in the substrate to at electrically isolate a portion of the first region from a portion of the second region, etching an upper surface of the second region of the substrate, forming a protection layer covering the first channel layer in the first region of the substrate and covering the second region of the substrate, removing the protection layer on the second region of the substrate, forming a gate insulation material layer on the protection layer and on the second region of the substrate, and removing the gate insulation material layer and the protection layer on the first region of the substrate.

According to some example embodiments of the inventive concepts, a method of manufacturing a semiconductor device may include forming a first channel layer in a first region of a substrate, the substrate including the first region and a second region, the first channel layer including silicon germanium, etching an upper surface of the second region of the substrate, forming a protection layer covering the first channel layer in the first region of the substrate and covering the second region of the substrate, removing the protection layer on the second region of the substrate, forming a second channel layer in the second region of the substrate, forming a gate insulation material layer to cover the protection layer and on the second region of the substrate, and removing the gate insulation material layer and the protection layer on the first region of the substrate. The substrate may include a sequential stack of a first silicon layer, an insulation layer, and a second silicon layer. The first channel layer may be formed in the second silicon layer.

According to some example embodiments of the inventive concepts, a semiconductor device may include a substrate, the substrate including a first region, a second region, and a third region, an isolation region in the substrate, the isolation region electrically isolating respective portions of the first, second, and third regions from each other, a first channel layer in the first region of the substrate, a first gate insulation layer on the first channel layer, a second gate insulation layer on the second region of the substrate, a third gate insulation layer on the third region of the substrate, first source/drain regions in the first channel layer, second source/drain regions in the second region of the substrate, a second channel layer in the second region of the substrate and between the second source/drain regions, third source/drain regions in the third region of the substrate, and a third channel layer in the third region of the substrate and between the third source/drain regions. An upper surface of the first channel layer may be distal from a bottom surface of the substrate in relation to both an upper surface of the second channel layer and an upper surface of the third channel layer.

DETAILED DESCRIPTION

Figure 1:
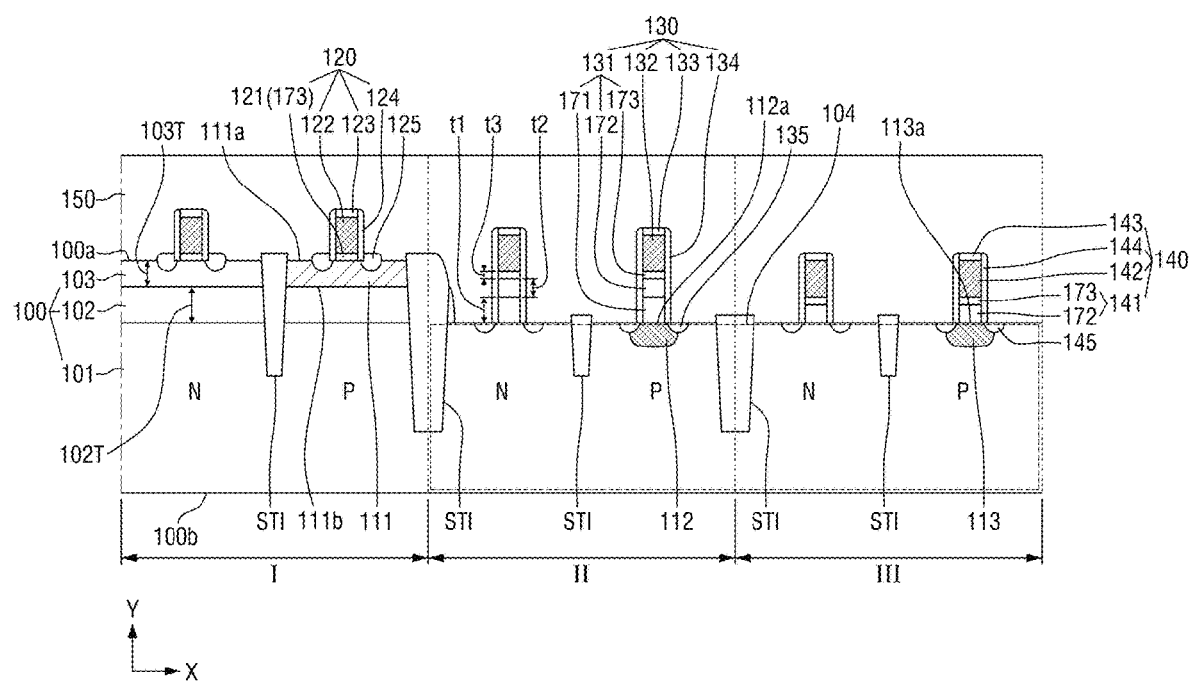
FIG. 1 is a view illustrating a semiconductor device according to some example embodiments of the inventive concepts.

Various example embodiments will now be described more fully hereinafter with reference to the accompanying drawings. Like reference numerals may refer to like elements throughout this application.

FIG. 1 is a view illustrating a semiconductor device according to some example embodiments of the inventive concepts.

Referring to FIG. 1, a semiconductor device may include a substrate 100, first, second, and third channel layers 111, 112, and 113, first, second, and third gate structures 120, 130, and 140, first, second, third source/drain regions 125, 135, and 145, an interlayer insulation layer 150, and an isolation region STI.

The substrate 100 may be a bulk silicon substrate or a silicon-on-insulator (SOI) substrate. In some example embodiments, the substrate 100 may include a semiconductor material different from silicon, for example, indium antimonide, lead telluride, indium arsenic, indium phosphide, gallium arsenic, or gallium antimonide, but the inventive concepts are not limited thereto. Hereinafter, it will be described that the substrate 100 is the SOI substrate.

The substrate 100 may include a first silicon layer 101, an insulation layer 102, and a second silicon layer 103. The insulation layer 102 may include, for example, silicon oxide (SiO$_2$), but the inventive concepts are not limited thereto. For example, the first silicon layer 101 may be a silicon substrate.

The insulation layer 102 may have, for example, a thickness 102T of about 100 Å to about 1000 Å, and the second silicon layer 103 may have, for example, a thickness 103T of about 50 Å to about 500 Å, but the inventive concepts is not limited thereto.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The substrate 100 may include a first region I, a second region II, and a third region III that are adjacent to each other.

For example, a low voltage transistor may be disposed in the first region I, a high voltage transistor may be disposed in the second region II, and an intermediate voltage transistor may be disposed in the third region III.

Each of the first region I, the second region II, and the third region III may include an NMOS region N and a PMOS region P.

In FIG. 1, it is illustrated that the low voltage transistor, the high voltage transistor, and the intermediate voltage transistor are sequentially disposed, but the inventive concepts is not limited thereto. In some example embodiments, an arrangement order of the low voltage transistor, the high voltage transistor, and the intermediate voltage transistor may be changed.

The first channel layer 111 may be disposed in the first region I of the substrate 100. Specifically, the first channel layer 111 may be disposed in the second silicon layer 103 of the PMOS region P in the first region I. Accordingly, the PMOS region P and the NMOS region N in the first region may be referred to as fourth and fifth regions of the substrate 100, the first channel layer 111 may be understood to be in the fourth region, and a lower surface 111b of the first channel layer 111 may be understood to be lower (e.g., proximate to the bottom surface 100b of the substrate) in relation to an upper surface of the fifth region of the substrate 100, where such upper surface of the fifth region may be the upper surface 100a of the substrate 100.

The first channel layer 111 may contact the insulation layer 102. In some example embodiments, the first channel layer 111 may be spaced apart from the insulation layer 102.

The first channel layer 111 may include, for example, silicon germanium (SiGe), but the inventive concepts are not limited thereto.

The second channel layer 112 may be disposed in the second region II of the substrate 100. Specifically, the second channel layer 112 may be disposed in the first silicon layer 101 in the PMOS region P in the second region II.

The second channel layer 112 may include, for example, silicon germanium (SiGe), but the inventive concepts are not limited thereto.

The third channel layer 113 may be disposed in the third region III of the substrate 100. Specifically, the third channel layer 113 may be disposed in the first silicon layer 101 of the PMOS region P in the third region III.

The third channel layer 113 may include, for example, silicon germanium (SiGe), but the inventive concepts are not limited thereto.

The second channel layer 112 and the third channel layer 113 may be disposed at the same level with respect to an upper surface of the substrate 100 (e.g., may be at least partially coplanar with the upper surface 100a of the substrate 100). The second and third channel layers 112 and 113 may each include and/or totally comprise silicon (Si). The first channel layer 111 may be disposed at a different level from the second channel layer 112 and the third channel layer 113 with respect to the upper surface of the substrate 100. Restated, the first channel layer 111 may not be at least partially coplanar with the second channel layer 112 and/or the third channel layer 113. That is, an upper surface 111a of the first channel layer 111 may be located at a higher level than an upper surface 112a of the second channel layer 112 and an upper surface 113a of the third channel layer 113. Restated, the upper surface 111a of the first channel layer 111 may be distal from a bottom surface 100b of the substrate 100, in relation to the upper surface 112a of the second channel layer 112 and the upper surface 113a of the third channel layer 113. For example, a height difference between the upper surface of the first channel layer 111 and each of the upper surface of the second channel layer 112 and the upper surface of the third channel layer 113 may be in a range of about 150 Å to about 1500 Å.

The isolation region STI may be disposed in the substrate 100. The isolation region STI may be disposed between the first region I and the second region II in the substrate 100 and may separate the first region I and the second region II (e.g., at least partially isolate the first region I and the second region II from direct contact with each other), so as to electrically isolate at least a portion of the first region I from at least a portion of the second region II. The isolation region STI may be disposed between the second region II and the third region III in the substrate 100 and may separate the second region II and the third region III (e.g., at least partially isolate the second region II and the third region III from direct contact with each other), so as to electrically isolate at least a portion of the second region II from at least a portion of the third region III.

In addition, the isolation region STI may be disposed between the NMOS region N and the PMOS region P in the first region I and may separate the NMOS region N and the PMOS region P. The isolation region STI may be disposed between the NMOS region N and the PMOS region P in the second region II and may separate the NMOS region N and the PMOS region P. The isolation region STI may be disposed between the NMOS region N and the PMOS region P in the third region III and may separate the NMOS region N and the PMOS region P.

As described herein, where some layers (e.g., the insulation layers 102 and second silicon layers 103) of adjacent regions of the first to third regions I, II, and III of the substrate 100 are isolated from direct contact with each other, but at least one layer (e.g., the first silicon layers 101) of adjacent regions of the first to third regions I, II, and III of the substrate 100 are at least partially not isolated from direct contact with each other (e.g., may remain at least partially in direct contact with each other and/or part of a single, unitary, continuous layer), as shown in FIG. 1 for example, the first to third regions I, II, and III may still be referred to as being at least partially isolated from direct contact with each other or "separated" from each other.

As described herein, where some layers (e.g., the insulation layers 102 and second silicon layers 103) of adjacent regions of the first to third regions I, II, and III of the substrate 100 are electrically isolated from each other, but at least one layer (e.g., the first silicon layers 101) of adjacent regions of the first to third regions I, II, and III of the substrate 100 is at least partially not electrically isolated from each other (e.g., may remain at least partially in direct contact with each other and/or part of a single, unitary, continuous layer), as shown in FIG. 1, for example, the first to third regions I, II, and III may still be referred to as having respective one or more portions that are electrically isolated from each other or "separated" from each other.

The isolation region STI for separating the first to third region I, II, and III may extend into the substrate 100 further than the isolation region STI for separating the NMOS region and the PMOS region.

A width in a first direction X, (e.g., horizontal direction) of the isolation region STI for separating the first to third region I, II, and III may be greater than a width in the first direction X, of the isolation region STI for separating the NMOS region and the PMOS region. The first direction X may be parallel to an upper surface 100a of the substrate 100.

The isolation region STI may include, for example, silicon oxide ($SiO_2$), silicon nitride (SiN), silicon carbide (SiC), silicon oxycarbide (SiOC), silicon oxynitride (SiON), and/or silicon oxycarbonitride (SiOCN).

The isolation region STI may be formed of a single layer as shown in FIG. 1, but the inventive concepts are not limited thereto. For example, the isolation region STI may be formed of (e.g., may at least partially comprise) multiple layers.

The first gate structure 120 may be disposed on the second silicon layer 103 in the first region I. The first gate structure 120 on the NMOS region N may comprise or constitute an MOS transistor, and the first gate structure 120 on the PMOS region P may comprise or constitute a PMOS transistor.

The first gate structure 120 may include a first gate insulation layer 121, a first gate electrode 122, a first capping layer 123, and first gate spacers 124.

The first gate insulation layer 121 may be disposed on the second silicon layer 103 in the NMOS region N and on the first channel layer 111 in the PMOS region P, in the first region I. The first gate insulation layer 121 may be formed by patterning a third oxide layer 173 described below.

The first gate electrode 122 may be disposed on the first gate insulation layer 121 on the first region I. The first capping layer 123 may be disposed on the first gate electrode 122 on the first region I.

The first gate spacers 124 may be disposed on opposite sidewalls of the first gate insulation layer 121, the first gate electrode 122, and the first capping layer 123. The first gate spacers 124 may contact the opposite sidewalls of the first gate insulation layer 121, the first gate electrode 122, and the first capping layer 123, respectively.

The first source/drain regions 125 may be disposed at opposite sides of the first gate structure 120. The first source/drain regions 125 may be disposed in each of the second silicon layer 103 in the NMOS region N and the first channel layer 111 in the PMOS region P. Accordingly, it will be understood that at least some first source/drain regions 125 may be in the first channel layer 111.

It will be understood that elements described herein as being "in" other elements are at least partially located within a volume space defined by the outermost surfaces of the other elements. For example, in FIG. 1, first source/drain regions 125 are at least partially within the volume space defined by the outermost surfaces (e.g., the upper surface 111a) of the first channel layer 111 and therefore are understood to be "in" the first channel layer 111.

The first source/drain regions 125 may protrude from the second silicon layer 103 in the NMOS region N and the first channel layer 111 in the PMOS region P in a second direction Y (e.g., vertical direction), but the inventive concepts are not limited thereto. The second direction Y may be perpendicular to the first direction Y (i.e., perpendicular to the upper surface 100a of the substrate 100).

The second gate structure 130 may be disposed on the first silicon layer 101 of the second region II. The second gate structure 130 on the NMOS region N may comprise or constitute the NMOS transistor, and the second gate structure 130 on the PMOS region P may comprise or constitute the PMOS transistor.

The second gate structure 130 may include a second gate insulation layer 131, a second gate electrode 132, a second capping layer 133, and second gate spacers 134.

The second gate insulation layer 131 may be disposed on the first silicon layer 101 in the NMOS region N and on the second channel layer 112 in the PMOS region P, in the second region II. As shown, the second channel layer 112 in the second region II of the substrate 100 may be between the second source/drain regions 135. The second gate insulation layer 131 may include a first oxide layer 171, a second oxide layer 172 on the first oxide layer 171, and the third oxide layer 173 on the second oxide layer 172 that are described below. The second gate insulation layer 131 may be formed by patterning the first oxide layer 171, the second oxide layer 172, and the third oxide layer 173.

The second gate electrode 132 may be disposed on the second gate insulation layer 131 on the second region II. The second capping layer 133 may be disposed on the second gate electrode 132 on the second region II.

The second gate spacers 134 may be disposed on opposite sidewalls of the second gate insulation layer 131, the second gate electrode 132, and the second capping layer 133. The second gate spacers 134 may contact the opposite sidewalls of the second gate insulation layer 131, the second gate electrode 132, and the second capping layer 133, respectively.

The second source/drain regions 135 may be disposed at opposite sides of the second gate structure 130. The second source/drain regions 135 may be disposed in each of the first silicon layer 101 in the NMOS region N and the first silicon layer 101 in the PMOS region P. The second channel layer 112 may be disposed between the second source/drain regions 135 in the PMOS region P. It will be understood that at least some second source/drain regions 135 may be in the second region II of the substrate 100.

The third gate structure 140 may be disposed on the first silicon layer 101 in the third region III. The third gate structure 140 on the NMOS region N may comprise or constitute the NMOS transistor, and the third gate structure 140 on the PMOS region P may comprise or constitute the PMOS transistor.

The third gate structure 140 may include a third gate insulation layer 141, a third gate electrode 142, a third capping layer 143, and third gate spacers 144.

The third gate insulation layer 141 may be disposed on the first silicon layer 101 in the NMOS region N and on the third channel layer 113 in the PMOS region P, in the third region III. The third gate insulation layer 141 may include the second oxide layer 172 and the third oxide layer 173 on the second oxide layer 172. The third gate insulation layer 141 may be formed by patterning the second oxide layer 172 and the third oxide layer 173.

The third gate electrode 142 may be disposed on the third gate insulation layer 141 on the third region III. The third capping layer 143 may be disposed on the third gate electrode 142 on the third region III.

The third gate spacers 144 may be disposed on opposite sidewalls of the third gate insulation layer 141, the third gate electrode 142, and the third capping layer 143. The third gate spacers 144 may contact the opposite sidewalls of the third gate insulation layer 141, the third gate electrode 142, and the third capping layer 143, respectively.

The third source/drain regions 145 may be disposed at opposite sides of the third gate structure 140. The third source/drain regions 145 may be disposed in each of the first silicon layer 101 in the NMOS region N and the first silicon layer 101 in the PMOS region P. It will be understood that the third source/drain regions 145 may be in the third region III of the substrate 100. The third channel layer 113 may be disposed between the third source/drain regions 145 in the PMOS region P and thus may be in the third region III of the substrate 100 in addition to being between third source/drain regions 145.

A first thickness t1 of the first oxide layer 171 in the second direction Y may be greater than a second thickness t2 of the second oxide layer 172 in the second direction Y. In addition, the second thickness t2 of the second oxide layer 172 in the second direction Y may be greater than a third thickness t3 of the third oxide layer 173 in the second direction Y.

In other words, a thickness in the second direction Y of the second gate insulation layer 131 on the second region II in which the high voltage transistor is formed may be greater than a thickness in the second direction Y of the third gate insulation layer 141 on the third region III in which the intermediate voltage transistor is formed. In addition, the thickness in the second direction Y of the third gate insulation layer 141 on the third region III in which the intermediate voltage transistor is formed may be greater than a thickness in the second direction Y of the first gate insulation layer 121 on the first region I in which the low voltage transistor is formed. It will be understood that the first direction X may be a horizontal direction extending parallel to the upper surface 100a and/or bottom surface 100b of the substrate 100, and the second direction Y may be a vertical direction extending perpendicular to the upper surface 100a and/or bottom surface 100b of the substrate 100.

Each of the first to third oxide layers 171, 172, and 173 may include silicon oxide (SiO$_2$). In some example embodiments, each of the first to third oxide layers 171, 172, and 173 may include silicon nitride (SiN), silicon oxynitride (SiON), or a high-k dielectric material having a higher dielectric constant than silicon oxide.

Each of the first to third gate electrodes 122, 132, and 142 may include, for example, titanium nitride (IiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbomitride (TaCN), tungsten (W), aluminum (Al), copper (Cu), cobalt (Co), titanium (Ti), tantalum (Ta), nickel (Ni). platinum (Pt), nickel platinum (Ni—Pt), niobium (Nb), niobium nitride (NbN), niobium carbide (NbC), molybdenum (Mo), molybdenum nitride (MoN), molybdenum carbide (Moc), tungsten carbide (WC), rhodium (Rh), palladium (Pd), iridium (Ir), osmium (Os), silver (Ag), gold (Au), zinc (Zn), and/or vanadium (V).

In some example embodiments, each of the first to third gate electrodes 122, 132, 142 may include, for example, a conductive metal oxide or a conductive meal oxynitride.

Each of the first to third capping layers 123, 133, and 143 may include, for example, silicon nitride (SiN), silicon oxynitride (SiON), silicon oxide (SiO$_2$), silicon carbonitride (SiCN), and/or silicon oxycarbonitride (SiOCN).

Each of the first to third gate spacers 124, 134, and 144 may include, for example, silicon oxide (SiO$_2$), silicon nitride (SiN), silicon oxynitride (SiON), silicon oxycarbonitride (SiOCN), and/or air.

The interlayer insulation layer 150 may cover the first to third gate structures 120, 130, and 140 and the isolation region STI. The interlayer insulation layer 150 may include, for example, silicon oxide (SiO$_2$), silicon nitride (SiN), and/or silicon oxynitride (SiON). The interlayer insulation layer 150 may be formed of a single layer. In some example embodiments, the interlayer insulation layer 150 may be formed of multiple layers.

In some example embodiments, the example embodiments shown in FIG. 1, where the first region I of the substrate 100 includes the sequential stack of the first silicon layer 101, the insulation layer 102, and the second silicon layer 103, the second and third regions II and III of the substrate 100 may include a third silicon layer 104 that is coplanar with the first silicon layer 101, where the second channel layer 112 and the third channel layer 113 are each in the third silicon layer 104.

FIGS. 2, 3, 4, 5, 6, 7, 8, 9, 10, 11, 12, 13, 14, 15, and 16 are views illustrating stages in a method of manufacturing a semiconductor device according to some example embodiments of the inventive concepts. It will be understood that, in some example embodiments, the method of manufacturing a semiconductor device according to some example embodiments may omit at least some of the operations shown in FIGS. 2-16 and/or may perform at least some of the operations shown in FIGS. 2-16 out of order in relation to the order (e.g., sequence) of operations shown in FIGS. 2-16.

Figure 2:
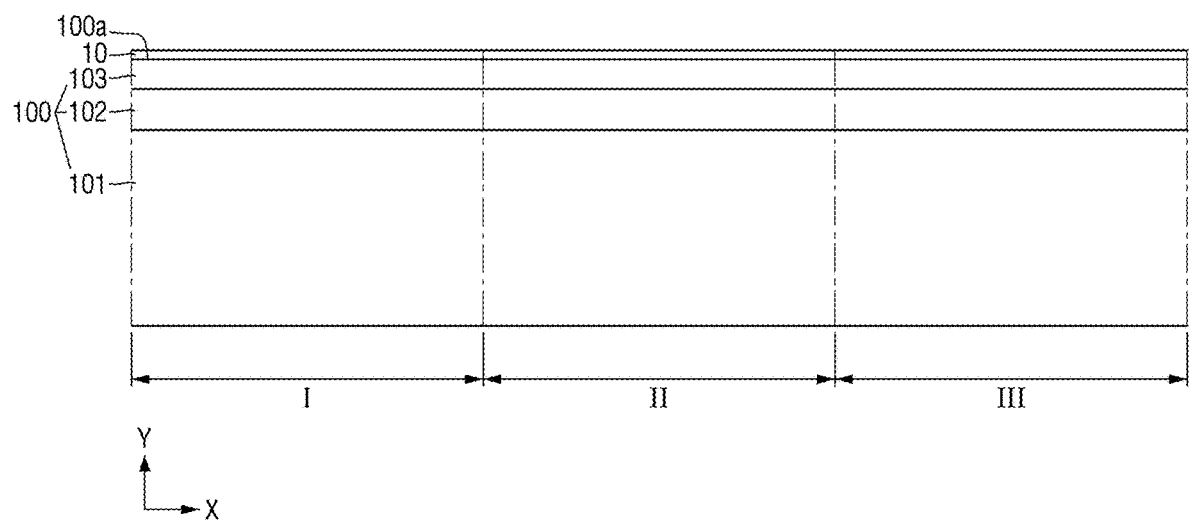
FIGS. 2, 3, 4, 5, 6, 7, 8, 9, 10, 11, 12, 13, 14, 15, and 16 are views illustrating stages in a method of manufacturing a semiconductor device according to some example embodiments of the inventive concepts.

Referring to FIG. 2, the substrate 100 including the first silicon layer 101, the insulation layer 102, and the second silicon layer 103 that are sequentially stacked may be provided (e.g., presented in a given location for manufacturing, where the given location is on a particular manufacturing device, in a particular location in relation to a particular manufacturing device, or the like). Restated, a substrate 100 that includes a sequential stack of the first silicon layer 101, the insulation layer 102, and the second silicon layer 103 may be provided. In some example embodiments, the providing of the substrate 100 may include forming the substrate 100, for example based on sequentially forming layers 101, 102, 103. The substrate 100 may include the first region I, the second region II, and the third region III that are adjacent to each other.

A pad oxide layer 10 may be conformally formed on an upper surface 100a of the substrate 100. That is, the pad oxide layer 10 may be conformally formed on the second silicon layer 103.

Figure 3:
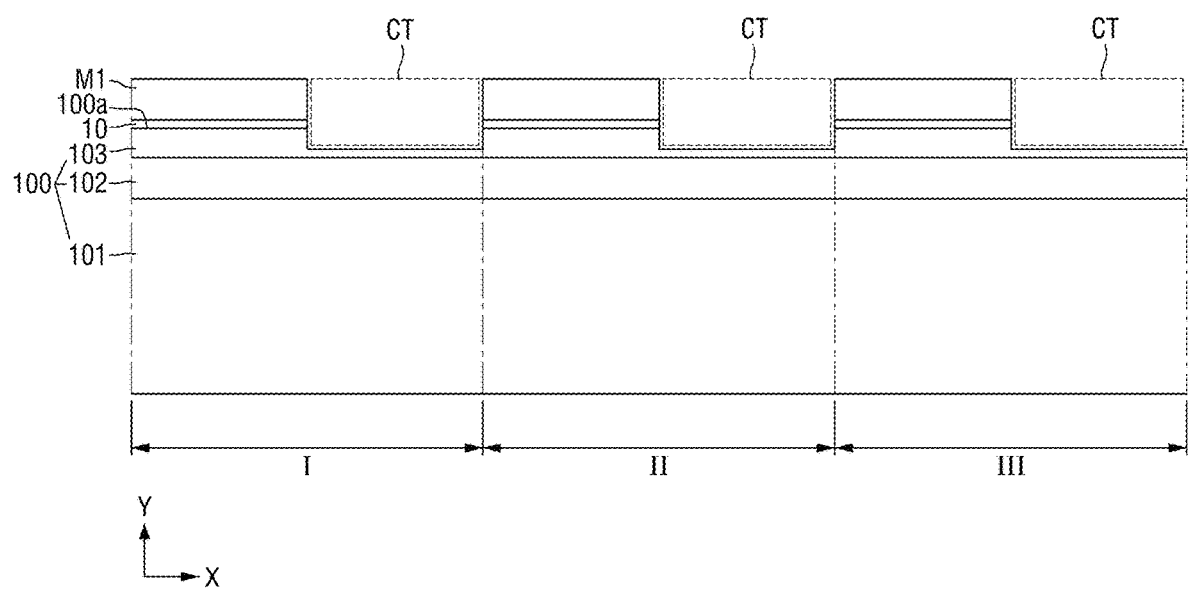

Referring to FIG. 3, a first mask pattern M1 may be formed on the pad oxide layer 10. A portion of the pad oxide layer 10 and a portion of the second silicon layer 103 may be etched using the first mask pattern M1 as an etch mask to form a channel trench CT in the second silicon layer 103. The channel trench CT may be formed in each of the first to third regions I, II, and III, but the inventive concepts is not limited thereto. For example, the channel trench CT may be formed in only the first region I.

Figure 4:
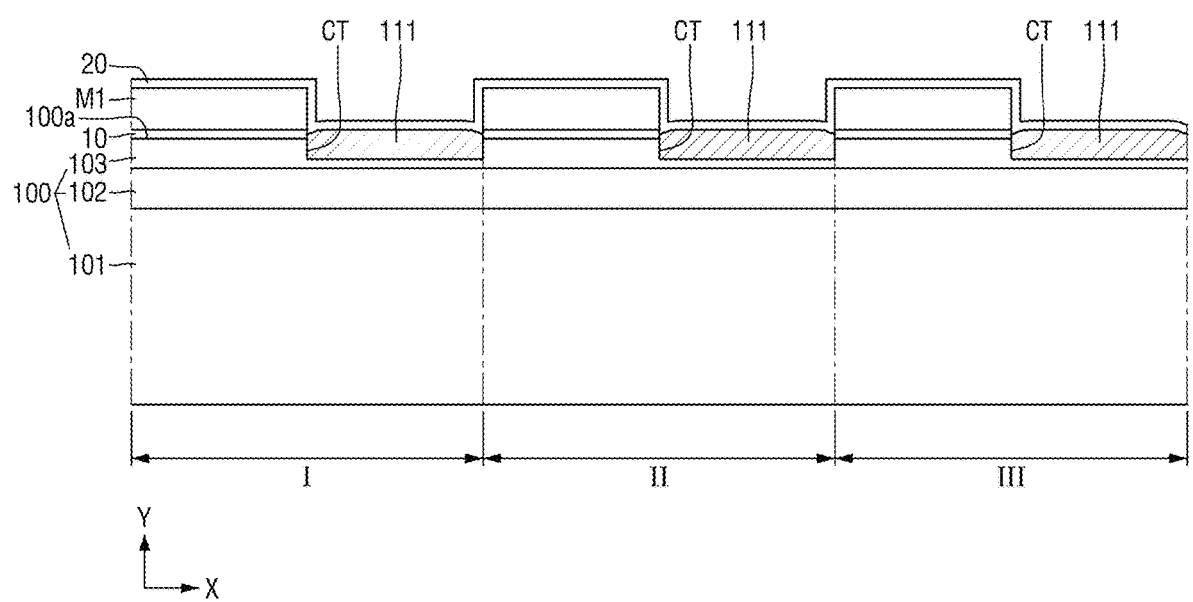

Referring to FIG. 4, the first channel layer 111 may be formed in the channel trench CT. Accordingly, where the channel trench CT is formed in the second silicon layer 103, the first channel layer 111 may be formed in the second silicon layer 103, such that the first channel layer 111 is at least partially coplanar with the second silicon layer 103 as shown in at least FIGS. 4-5. The first channel layer 111 may include or totally comprise, for example, silicon germanium (SiGe). The first channel layer 111 may be formed based on epitaxial growth in the channel trench CT, using silicon exposed on a sidewall and a bottom surface of the channel trench CT as a seed. For example, a silicon germanium layer SiGe as the first channel layer 111 may be epitaxially grown in the channel trench CT. As shown, the first channel layer 111 may be formed in separate channel trenches CT that are in separate regions I, II, and III of the substrate 100. In some example embodiments, each region of the substrate 100 may be defined to extend in the second direction Y to a height of upper surface 100a; because the channel trenches CT extend into an interior of the substrate 100 from the upper surface 100a, and the first channel layer 111 is formed within said channel trenches CT, the first channel layer 111 may be understood to be formed "in" the respective one or more regions of the substrate 100 in which the channel trenches CT are formed. Accordingly, it will be understood that the first channel layer 111 may be formed in the first region I of the substrate 100, the second region II of the substrate 100, and/or the third region III of the substrate 100, for example based on being formed in the respective channel trench(es) CT in the respective region(s) of the substrate 100. Accordingly, in some example embodiments, the forming of the first channel layer 111 may include forming a channel trench CT in the substrate, for example as shown in FIG. 3, and further forming the first channel layer 111 in the channel trench CT so as to partially or entirely fill the channel trench CT, but example embodiments are not limited thereto.

A capping oxide layer 20 may be conformally formed on the first channel layer 111, the first mask pattern M1, and the sidewall of the exposed channel trench CT.

Figure 5:
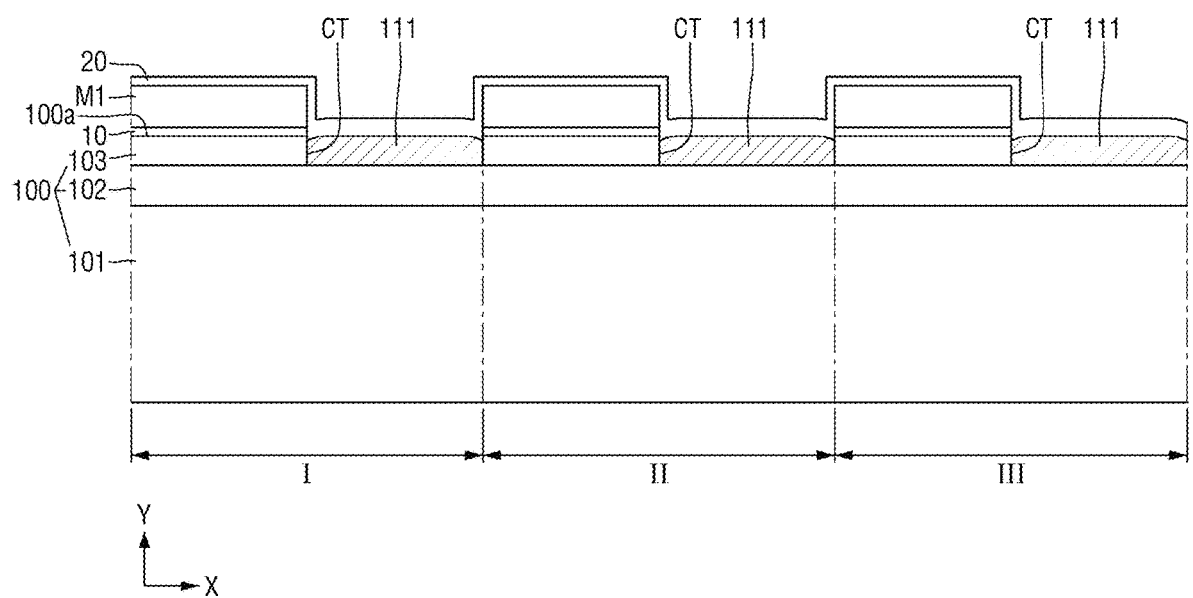

Referring to FIG. 5, an upper portion of the first channel layer 111 may be oxidized, and thus a silicon oxide ($SiO_2$) film may be formed and germanium (Ge) may be precipitated. The precipitated germanium (Ge) may react with the second silicon layer 103 below the first channel layer 111 to form a silicon germanium (SiGe) film.

As a result, as shown in FIG. 5, an upper surface of the first channel layer 111 may be lowered, and a lower surface of the first channel layer 111 may contact (e.g., directly contact) the insulation layer 102.

Figure 6:
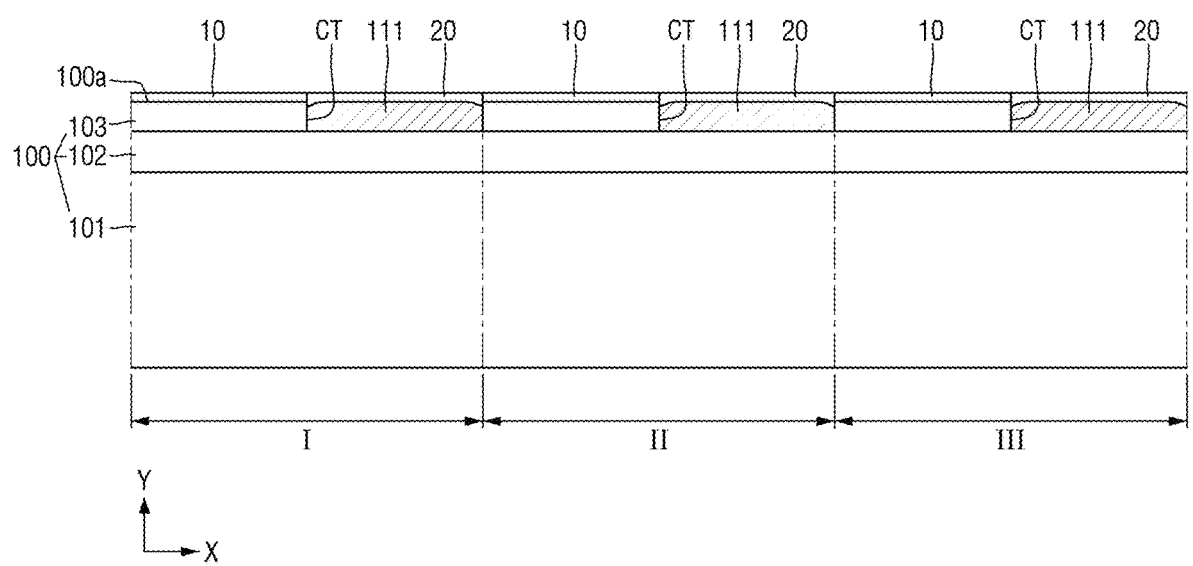

Referring to FIG. 6, a planarization process (e.g., a chemical mechanical polishing (CMP) process) may be performed to remove the first mask pattern M1 and a portion of the capping oxide layer 20 on the first channel layer 111. During the planarization process, the pad oxide layer 10 may function as an etch stop layer.

Figure 7:
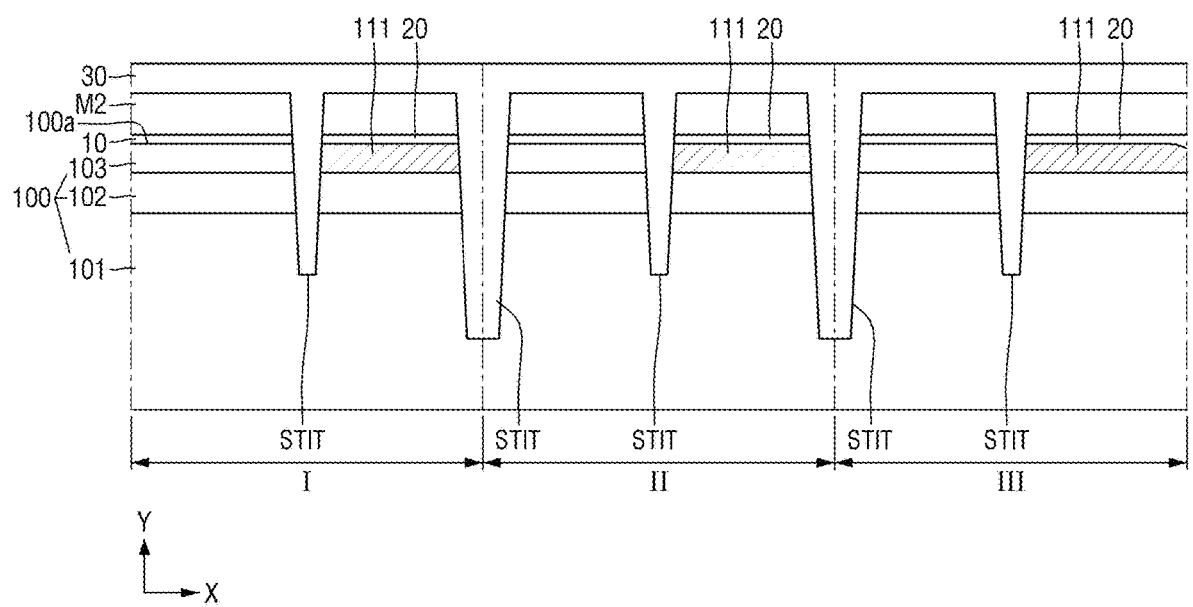

Referring to FIG. 7, a second mask pattern M2 may be formed on the pad oxide layer 10 and the capping oxide layer 20. A portion of the pad oxide layer 10, a portion of the capping oxide layer 20, a portion of the first channel layer 111, and the substrate 100 may be etched using the second mask pattern M2 as an etch mask to form an isolation trench STIT in the substrate 100. The first to third regions I, II, and III may be separated from each other (e.g., at least partially isolated from direct contact with each other and/or having respective one or more portions that are electrically isolated from each other) by the isolation trench STIT.

The isolation trench STIT may be formed in each of the first to third regions I, II, and III, such that the NMOS region (see N of FIG. 1) and the PMOS region (see P of FIG. 1) may be separated.

An isolation material layer 30 may be formed on the second mas pattern M2 and may fill the isolation trench STIT.

Figure 8:
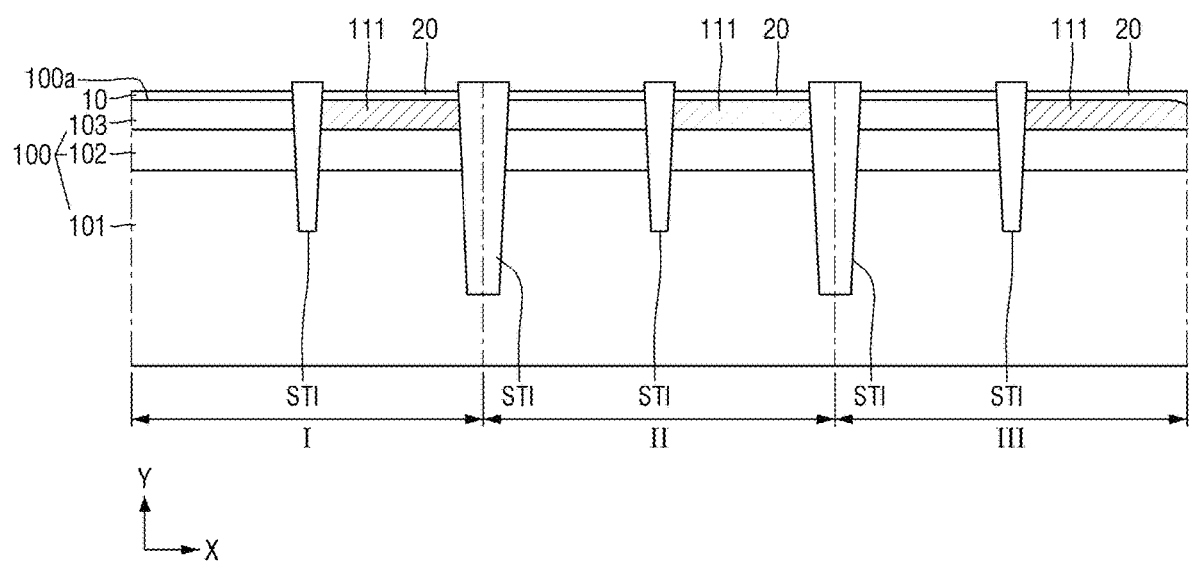

Referring to FIG. 8, an additional planarization process (e.g., a CMP process) may be performed to remove a portion of the second mask pattern M2 and a portion of the isolation material layer 30.

The second mask pattern M2 may be removed, thus forming the isolation region STI.

As shown in FIG. 8, a portion of the isolation region STI may protrude in the second direction Y over an upper surface of the pad oxide layer 10, but the inventive concepts are not limited thereto. In some example embodiments, an upper surface of the isolation region STI may be coplanar with the upper surface of the pad oxide layer 10. As shown, the isolation regions STI may at least partially isolate the first region I and the second region II from direct contact with each other, may at least partially isolate the second region II and the third region III from direct contact with each other, and the like. Accordingly, as shown in at least FIG. 8, it will be understood that the method according to some example embodiments as shown in FIGS. 2-16 may include forming an isolation region STI in the substrate 100 to at least partially isolate the first region I and the second region II from direct contact with each other. It will further be understood that the isolation region STI may be formed in the substrate 100 subsequently to forming the first channel layer 111.

As shown, the isolation regions STI may electrically isolate a portion of the first region I (e.g., portions of the insulation layer 102 and the second silicon layer 103 in the first region I) from a portion of the second region II (e.g., portions of the insulation layer 102 and the second silicon layer 103 in the second region II), but may not electrically isolate a separate portion of the first region I (e.g., first silicon layer 101) from a separate portion of the second region II (e.g., first silicon layer 101). As shown, the isolation regions STI may electrically isolate a portion of the second region II (e.g., portions of the insulation layer 102 and the second silicon layer 103 in the second region II) from a portion of the third region III (e.g., portions of the insulation layer 102 and the second silicon layer 103 in the third region III), but may not electrically isolate a separate portion of the second region II (e.g., first silicon layer 101) from a separate portion of the third region III (e.g., first silicon layer 101). Accordingly, as shown in at least FIG. 8, it will be understood that the method according to some example embodiments as shown in FIGS. 2-16 may include forming an isolation region STI in the substrate 100 to electrically isolate a portion of the first region I from a portion of the second region II. It will further be understood that the isolation region STI may be formed in the substrate 100 subsequently to forming the first channel layer 111.

Figure 9:
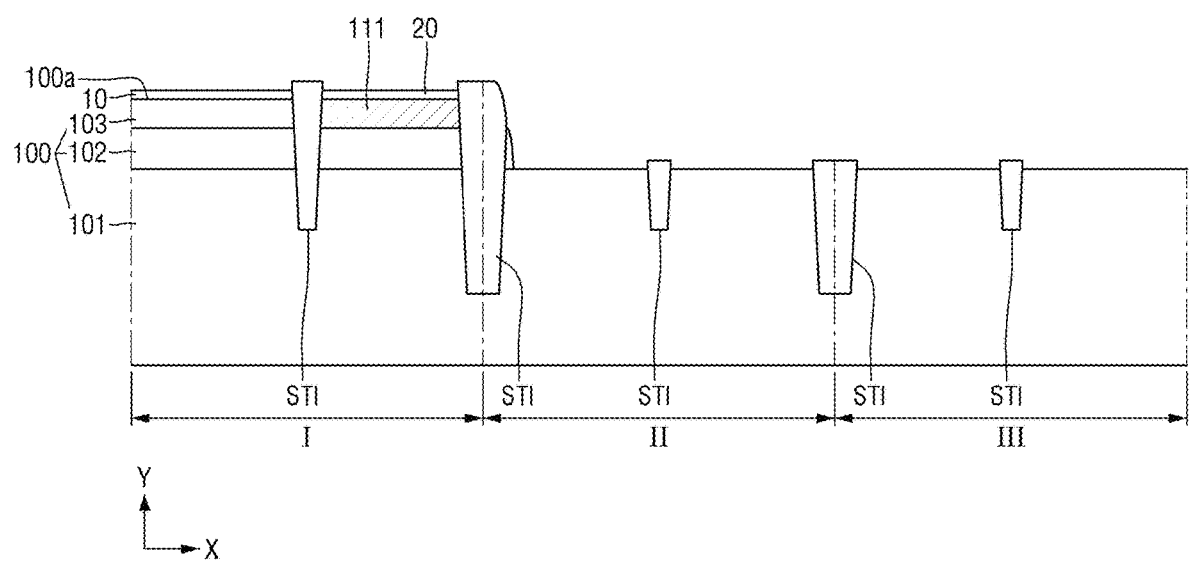

Referring to FIG. 9, the upper surface 100a of each of the second region II and the third region III of the substrate 100 may be etched to expose an upper surface of the first silicon layer 101. For example, the substrate 100 may be etched to a thickness of about 150 Å to about 1500 Å. In some example embodiments, the upper surface 100a of only one of the second region II or the third region III may be etched to expose the upper surface of the first silicon layer 101 in said etched region.

Specifically, the pad oxide layer 10, the capping oxide layer 20, the second silicon layer 103, the insulation layer 102, and a portion of the isolation region STI in each of the second region II and the third region III may be removed using a mask pattern formed on the first region I as an etch mask.

Figure 10:
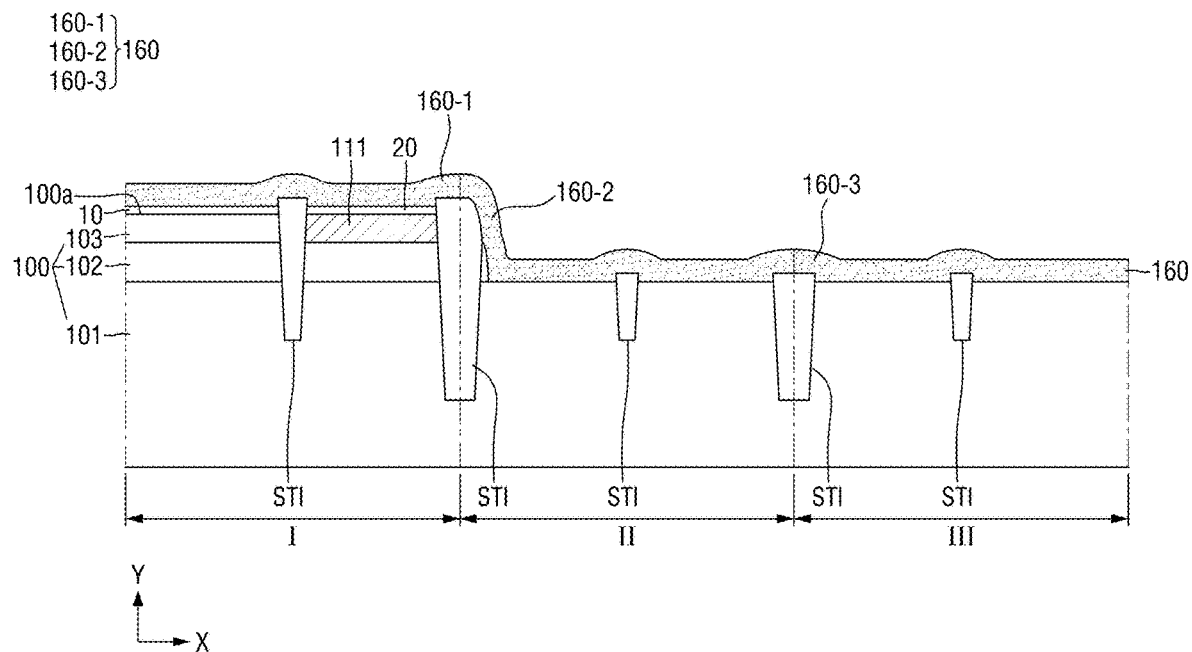

Referring to FIG. 10, a protection layer 160 may be formed to cover first to third regions I, II, and III of the substrate 100. The protection layer 160 may include, for example, silicon nitride. As shown in FIG. 10, the protection layer 160 may be formed on the first region I of the substrate 100 and the etched second region II of the substrate to cover (e.g., isolate from exposure) the first channel layer 111 in the first region I of the substrate 100 and to cover the second region II of the substrate 100, such that separate, first to third portions 160-1, 160-2, and 160-3 of the protection layer 160 are formed on separate, respective regions I to III of the substrate 100. As shown in FIG. 10, the protection layer 160 may be a single, continuous, uniform layer (e.g., a single, unitary part) that may be understood to have separate portions 160-1, 160-2, 160-3 defined by the separate, respective regions I, II, III of the substrate 100 upon which the respective portions 160-1, 160-2, 160-3 are directly or indirectly located. In some example embodiments, the protection layer 160 may be formed to cover only one or some of the regions of the substrate 100. For example, in some example embodiments, the protection layer 160 may be formed to cover the first and second regions I and II of the substrate 100 but not the third region III. In some example embodiments, for example where the substrate 100 omits the second region II and thus the first and third regions I and III are directly adjacent to each other, the protection layer 160 may be formed to cover the first and third region I and III of the substrate 100 but not a second region II.

Figure 11:
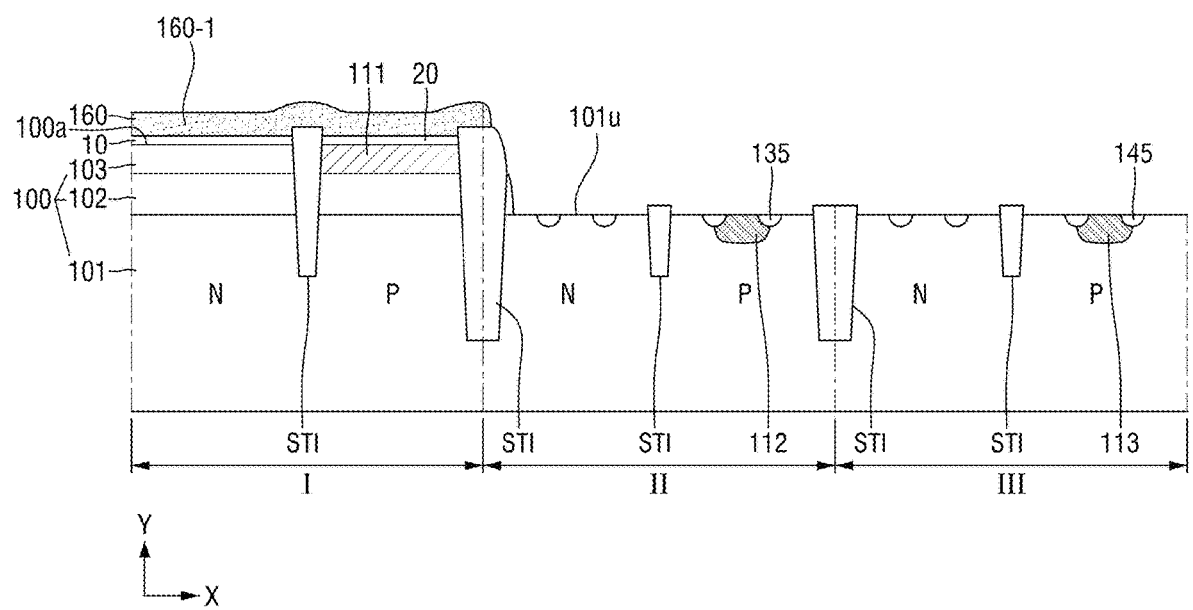

Referring to FIG. 11, the portions of the protection layer 160 on the second region II and the third region III may be removed. Specifically, the one or more portions 160-2 and 160-3 of the protection layer 160 that are on each of the second region II and the third region III may be etched, so as to be removed, using a mask pattern formed on the first region I as an etch mask. As shown in FIG. 11, the second and third portions 160-2 and 160-3 of the protection layer 160 may be removed, leaving only the first portion 160-1 of the protection layer 160 that is on the first region I of the substrate 100. In some example embodiments, the second portion 160-2 of the protection layer 160 that is on only the second region II of the substrate 100 is removed.

An impurity injection process may be performed to inject impurities in the substrate 100, and thus the NMOS region N and the PMOS region P may be formed in each of the first to third region I, II, and III. In addition, by an impurity injection process, the second source/drain regions 135 may be formed in an upper surface of the first silicon layer 101 of the second region II, and the third source/drain regions 145 may be formed in an upper surface of the first silicon layer 101 in the third region III. In some example embodiments, by an impurity injection process, the second channel layer 112 may be formed in the first silicon layer 101 between second source/drain regions 135 in the PMOS region P of the second region II, and the third channel layer 113 may be formed the first silicon layer 101 between the third source/drain regions 145 in the PMOS region P of the third region III. Accordingly, a second channel layer 112 may be formed in at least the second region II of the substrate 100, and a third channel layer 113 may be formed in at least the third region III of the substrate 100, subsequently to removing the second and third portions 160-2 and 160-3 of the protection layer 160.

The first channel layer 111 may be formed by the epitaxial growth as described with reference to FIG. 4, and the second channel layer 112 and the third channel layer 113 may be formed by the impurity injection process.

The second channel layer 112 and the third channel layer 113 may include, for example, silicon germanium, but the inventive concepts are not limited thereto.

The protection layer 160 may prevent the first channel layer 111 from being oxidized and prevent germanium (Ge) from being precipitated from the first channel layer 111.

Figure 12:
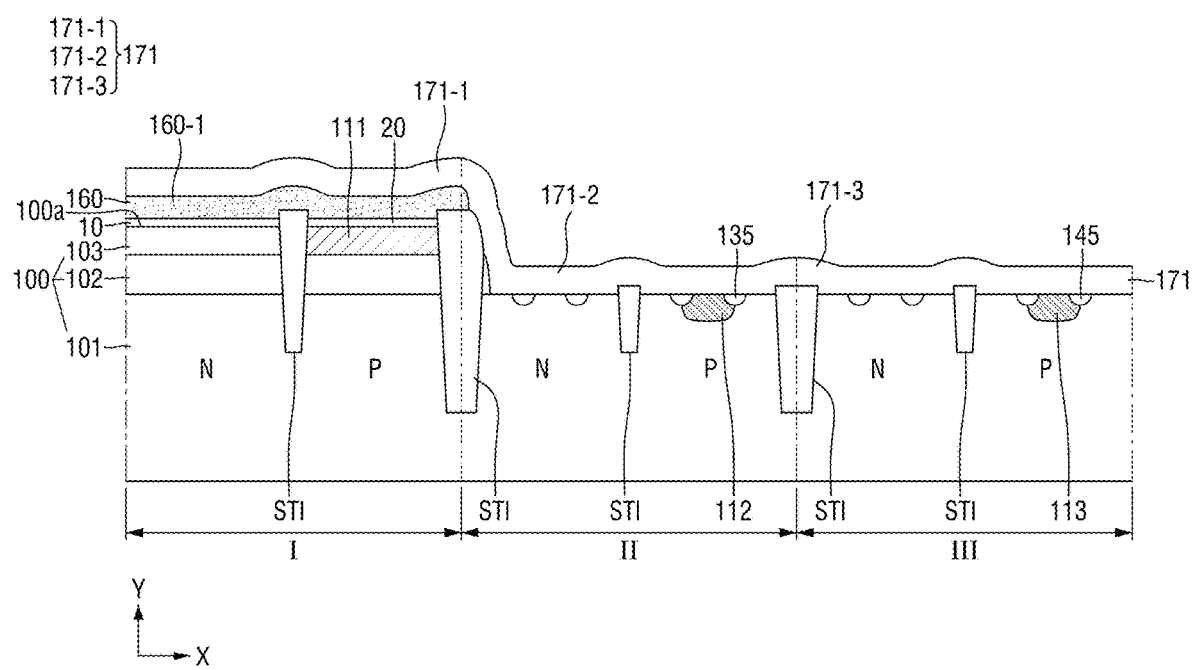
Figure 13:
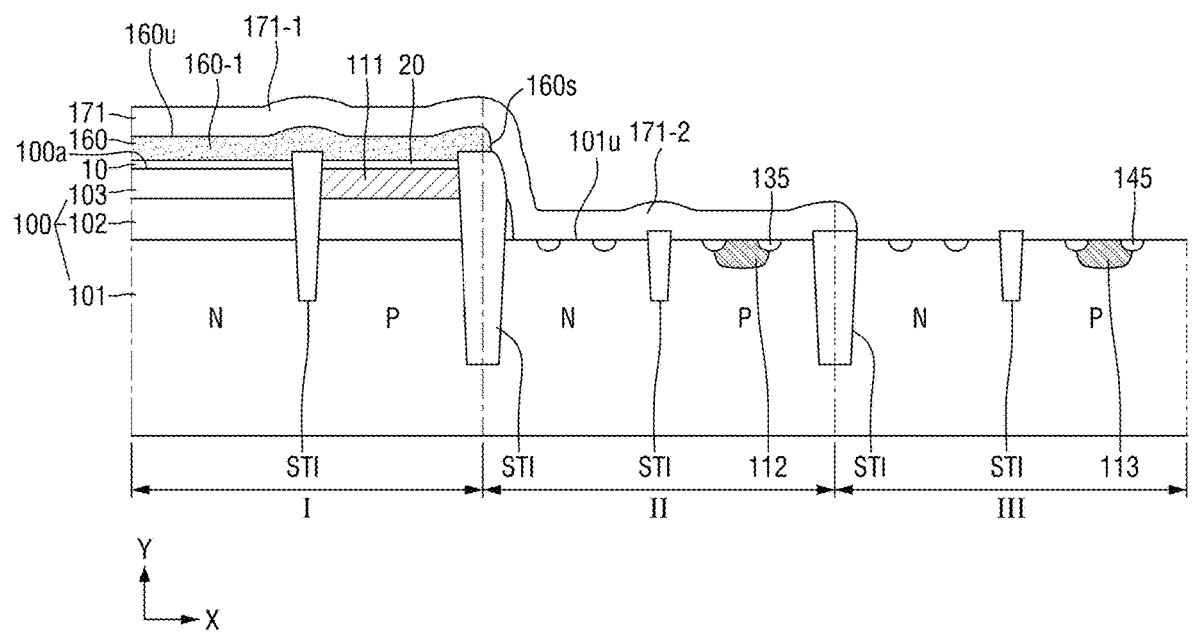
Figure 14:
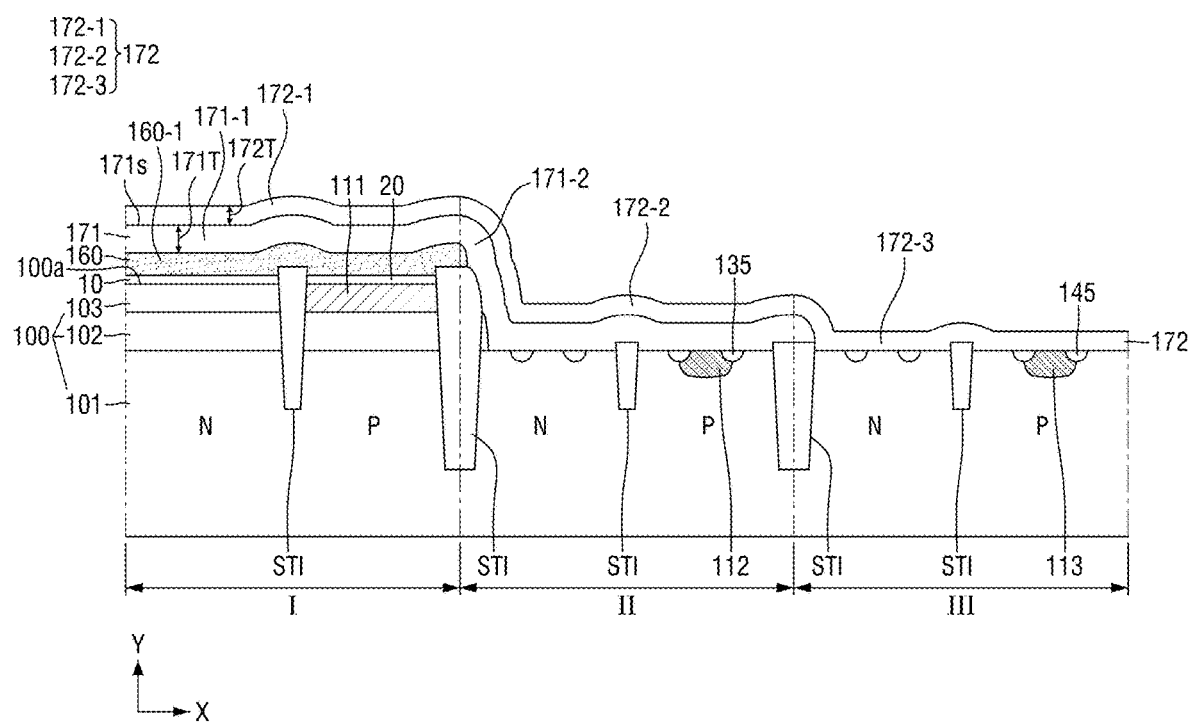

Referring to FIGS. 12 to 14, gate insulation material layers (e.g., first and second oxide layers 171 and 172) may be formed to cover the protection layer 160 on the first region I, the first silicon layer 101 in the second region II, and the first silicon layer 101 in the third region III. In some example embodiments, only one of the gate insulation material layers (e.g., only one of the first or second oxide layers 171 or 172, for example only the first oxide layer 171) may be formed on the protection layer 160 and on the second region II of the substrate 100.

Referring to FIG. 12, a first oxide layer 171 as a gate insulation material layer may be conformally formed to cover the protection layer 160 on the first region I, the first silicon layer 101 in the second region II, and the first silicon layer 101 in the third region III. The first oxide layer 171 may be formed on the isolation region STI, the second source/drain regions 135, the third source/drain regions 145, the second channel layer 112, and the third channel layer 113. As shown in FIG. 12, the first oxide layer 171 may be a single, continuous, uniform layer (e.g., a single, unitary part) that may be understood to have separate portions 171-1, 171-2, 171-3 defined by the separate, respective regions I, II, III of the substrate 100 upon which the respective portions 171-1, 171-2, 171-3 are directly or indirectly located.

Referring to FIG. 13, the first oxide layer 171 on the third region III (e.g., the third portion 171-3 of the first oxide layer 171) may be removed using a mask pattern formed on the first oxide layer 171 on the first region I and the second region II as an etch mask. Accordingly, a gate insulation material layer that is the first oxide layer 171 may be formed on the remaining first portion 160-1 of the protection layer 160 and on the exposed second region II of the substrate 100 (e.g., an upper surface 101u of the second region II of the substrate 100), such that the first oxide layer 171 is a continuous layer that includes a first portion 171-1 that is in direct contact with at least one surface (e.g., an upper surface 160u and/or side surface 160s) of the remaining first portion of the protection layer 160 and a second portion 171-2 that is in direct contact with an upper surface 101u of at least the second region II of the substrate 100.

While at least FIGS. 11-13 show small amounts of the protection layer 160 extending over the boundary between the first and second regions I and II, the protection layer 160 shown in FIGS. 11-13 will be understood to include only the first portion 160-1 of the protection layer 160. Similarly, while FIGS. 13-16 show small amounts of the first oxide layer 171 extending over the boundary between the second and third regions II and III, the first oxide layer 171 shown in FIGS. 13-16 will be understood to include only the first and second portions 171-1 and 171-2 of the first oxide layer 171. In some example embodiments, the first oxide layer 171 may be referred to as a gate insulation material layer, and the first, second, and third portions 171-1, 171-2, and 171-3 of the first oxide layer 171 may be referred to as respective first, second, and third portions of the gate insulation material layer.

Referring to FIG. 14, a second oxide layer 172 as a separate gate insulation material layer may be conformally formed to cover the first oxide layer 171 on the first region I, the first oxide layer 171 on the second region II, the first silicon layer 101 in the third region III. The second oxide layer 172 may be formed on the isolation region STI, the third source/drain regions 145, and the third channel layer 113 that are exposed. As shown in FIG. 14, the second oxide layer 172 may be a single, continuous, uniform layer (e.g., a single, unitary part) that may be understood to have separate portions 172-1, 172-2, 172-3 defined by the separate, respective regions I, II, III of the substrate 100 upon which the respective portions 172-1, 172-2, 172-3 are directly or indirectly located.

Accordingly, forming the gate insulation material layer may include removing the third portion 171-3 of the first oxide layer 171 that is on the third region III of the substrate 100 and forming the second oxide layer 172 on at least the remaining first portion 171-1 and second portion 171-2 of the first oxide layer 171 and on the exposed third region III of the substrate 100 (e.g., an upper surface 101u of the third region III of the substrate 100), such that the second oxide layer 171 is a continuous layer that includes a first portion 172-1 that is in direct contact with at least one surface 171s of the remaining first portion 171-1 of the first oxide layer 171, a second portion 172-2 that is in direct contact with at least one surface 171s of the remaining second portion 171-2 of the first oxide layer 171, and a third portion 172-3 that is in direct contact with an upper surface 101u of at least the third region III of the substrate 100. The second oxide layer 172 may omit the third portion 172-3. In some example embodiments, the first oxide layer 171 and the second oxide layer 172 may be referred to collectively as the gate insulation material layer.

It will be understood that, in some example embodiments, the second region II may be omitted, such that the third region III of the substrate 100 is referred to as a second region of the substrate.

The second oxide layer 172 may be formed thinner than the first oxide layer 171, such that the first oxide layer 171 has a substantially uniform thickness 171T (e.g., with variation of up to 10% from the stated magnitude of the thickness 171T on a horizontal surface that extends parallel to the upper surface 100a of the substrate) in the second direction Y, the second oxide layer 172 has a substantially uniform thickness 172T (e.g., with variation of up to 10% from the stated magnitude of the thickness 172T on a horizontal surface that extends parallel to the upper surface 100a of the substrate) in the second direction Y, and the thickness 171T of the first oxide layer 171 is greater than the thickness 172T of the second oxide layer 172.

While the gate insulation material layers (e.g., first and second oxide layers 171 and 172) are formed at a high temperature, the protection layer 160 may prevent the first channel layer 111 from being oxidized and prevent germanium (Ge) from being precipitated from the first channel layer 111.

Figure 15:
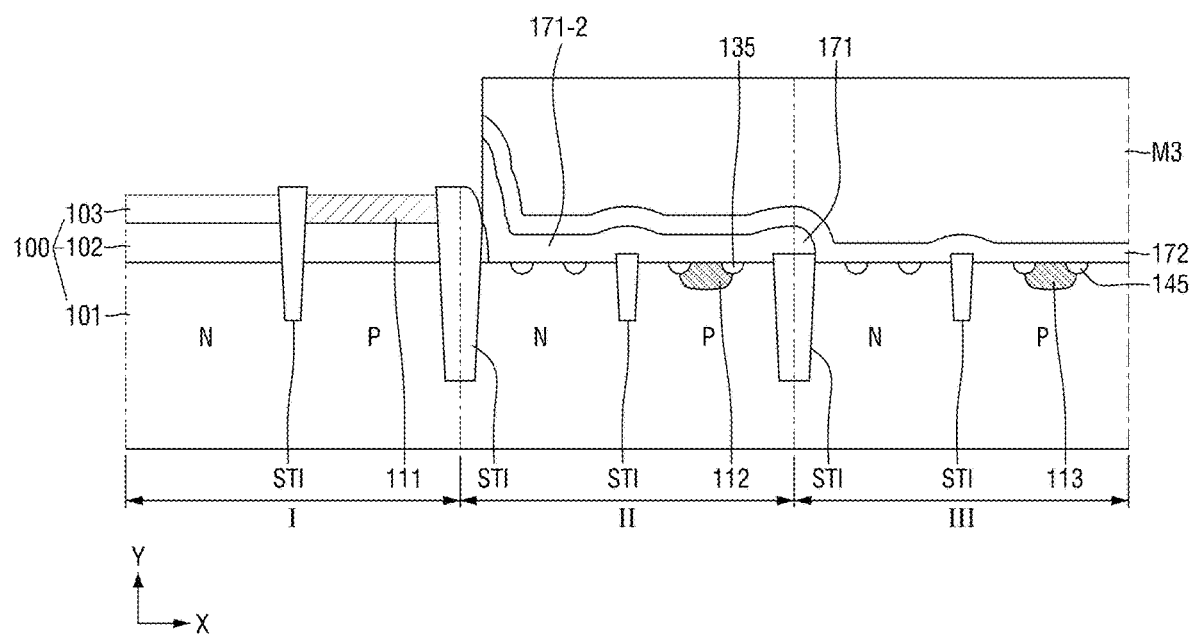

Referring to FIG. 15, a third mask pattern M3 may be formed on the second oxide layer 172 on the second region II and the third region III. The third mask pattern M3 may be, for example, a photoresist pattern, but the inventive concepts is not limited thereto.

The second oxide layer 172, the first oxide layer 171, the protection layer 160, the pad oxide layer 10, and the capping oxide layer 20 that are formed on the first region of the substrate may be sequentially removed using the third mask pattern M3 as an etch mask.

Specifically, the second oxide layer 172 and the first oxide layer 171 may be removed by a wet etching process. The protection layer 160 may prevent the isolation region STI in the first region I from being etched while the second oxide layer 172 and the first oxide layer 171 are removed through the wet etching process, such that a dent phenomenon may be prevented from occurring in the isolation region STI.

The protection layer 160 may be removed by a dry etching process. In some example embodiments, the protection layer 160 may be removed by a wet etching process.

Accordingly, as shown in FIG. 15, at least the first portion 160-1 of the protection layer 160 and the first portion 171-1 of the first oxide layer 171 (e.g., the first portion of the gate insulation material layer) that are on the first region I of the substrate 100 may be removed.

The pad oxide layer 10 and the capping oxide layer 20 may be removed by a wet etching process.

Through the aforementioned processes, the upper surface of the first channel layer 111 and an upper surface of the second silicon layer 103 in the first region I may be exposed.

Figure 16:
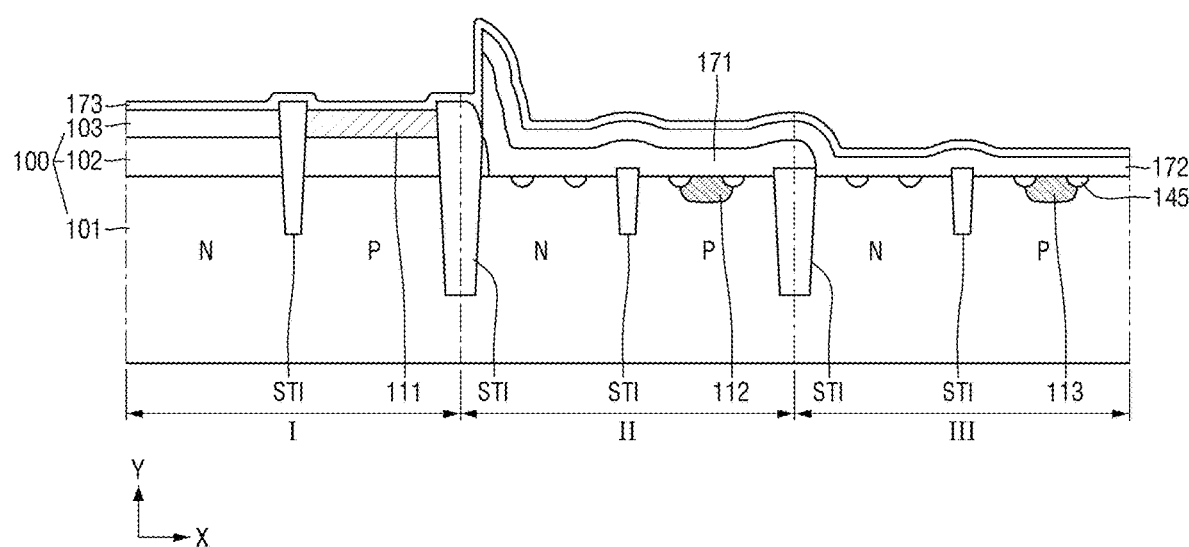

Referring to FIG. 16, after the third mask pattern M3 is removed, a third oxide layer 173 as the gate insulation material layer may be conformally formed on the first to third regions I, II, and III of the substrate 100. Specifically, the third oxide layer 173 may be formed on the isolation region STI, the second silicon layer 103, the first channel layer 111, and the second oxide layer 172 that are exposed. The third oxide layer 173 may be formed thinner than the second oxide layer 172. The third oxide layer 173 may be formed thinner than the second oxide layer 172.

Referring again to FIG. 1, the first gate structure 120 may be formed on the second silicon layer 103 and the first channel layer 111 in the first region I. The second gate structure 130 may be formed on the first silicon layer 101 and the second channel layer 112 in the second region II. The third gate structure 140 may be formed on the first silicon layer 101 and the third channel layer 113 in the third region III.

The first to third gate structures 120, 130, and 140 may be formed by a gate first process.

The first source/drain regions 125 may be formed in the first channel layer 111 and the second silicon layer 103 at opposite sides of the first gate structure 120. The interlayer insulation layer 150 may be formed to cover the first to third gate structures 120, 130, and 140 and the substrate 100.

Accordingly, the semiconductor device as shown in FIG. 1 may be manufactured by the processes described above.

In the method of manufacturing the semiconductor device according to some example embodiments, by forming the protection layer 160 on the silicon germanium channel (SiGe) layer in the region where the low voltage transistor is formed, during the high temperature process, the silicon germanium channel (SiGe) layer may be prevented from being oxidized and germanium may be prevented from being precipitated from the silicon germanium channel (SiGe) layer.

In the method of manufacturing the semiconductor device according to some example embodiments, by forming the protection layer 160 on the silicon germanium channel layer (SiGe) in the region where the low voltage transistor is formed, while the wet etching process is performed on the region where the high voltage transistor is formed, the dent phenomenon may be prevented from occurring in the isolation region STI in the region where the low voltage transistor is formed.

A method of manufacturing a semiconductor device according to some example embodiments are described with reference to FIG. 17. Differences between the method of manufacturing the semiconductor device as shown in FIGS. 1 to 16 and a method of manufacturing a semiconductor device of FIG. 17 are described.

Figure 17:
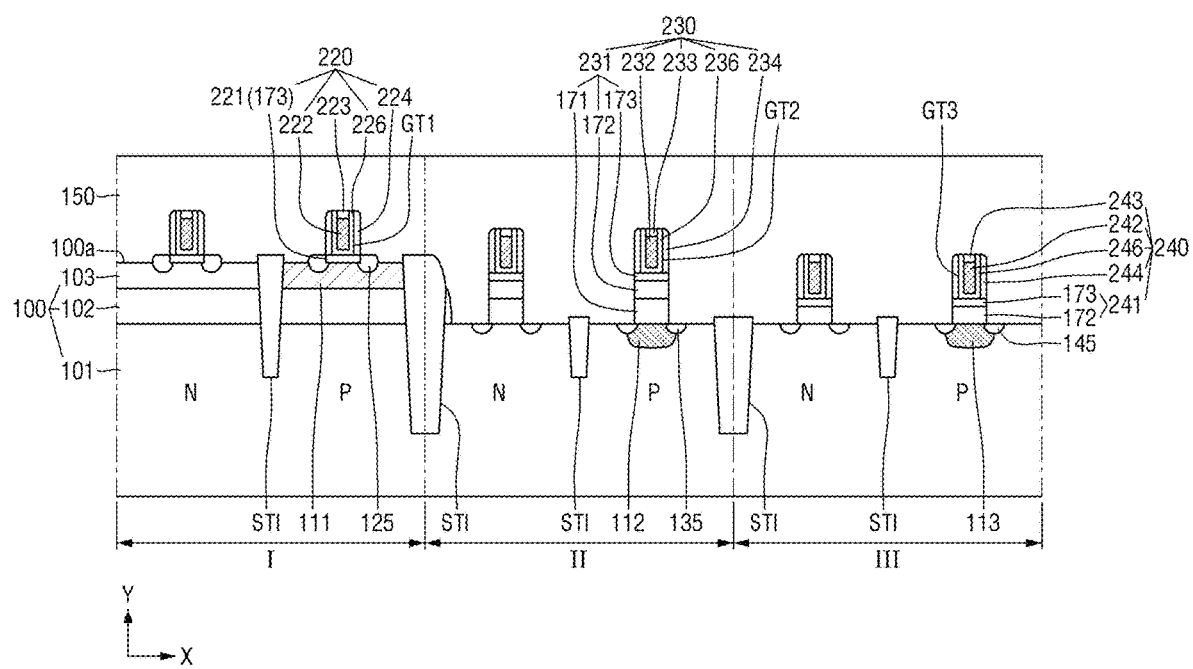
FIG. 17 is a view illustrating a semiconductor device according to some example embodiments of the inventive concepts.

FIG. 17 is a view illustrating a semiconductor device according to some example embodiments of the inventive concepts.

Referring to FIG. 17, after the processes described with reference to FIGS. 2 to 16 are performed, a first gate structure 220 may be formed on the second silicon layer 103 and the first channel layer 111 in the first region I. A second gate structure 230 may be formed on the first silicon layer 101 and the second channel layer 112 in the second region II. A third gate structure 240 may be formed on the first silicon layer 101 and the third channel layer 113 in the third region III.

The first to third gate structures 220, 230, and 240 may be formed by a gate last process.

The first gate structure 220 may include a first gate insulation layer 221, a first gate electrode 222, a first capping layer 223, first gate spacers 224, and a first high-k dielectric layer 226.

The first gate insulation layer 221 may be formed on the second silicon layer 103 in the NMOS region N in the first region I and on the first channel layer 111 in the PMOS region P in the first region I.

The first gate spacers 224 defining a first gate trench GT1 may be formed on the first gate insulation layer 221. The first high-k dielectric layer 226 may be formed along a sidewall and a bottom surface of the first gate trench GT1. The first gate electrode 222 and the first capping layer 223 may be sequentially formed on the first high-k dielectric layer 226 and may fill the first gate trench GT1.

The second gate structure 230 may include a second gate insulation layer 231, a second gate electrode 232, a second capping layer 233, second gate spacers 234, and a second high-k dielectric layer 236.

The second gate insulation layer 231 may be formed on the first silicon layer 101 in the NMOS region N in the second region II and on the second channel layer 112 in the PMOS region P in the second region II, and thus the second gate insulation layer 231 may be on the second region II of the substrate 100.

The second gate spacers 234 defining a second gate trench GT2 may be formed on the second gate insulation layer 231. The second high-k dielectric layer 236 may be formed along a sidewall and a bottom surface of the second gate trench GT2. The second gate electrode 232 and the second capping layer 233 may be sequentially formed on the second high-k dielectric layer 236 and may fill the second gate trench GT2.

The third gate structure 240 may include a third gate insulation layer 241, a third gate electrode 242, a third capping layer 243, third gate spacers 244, and a third high-k dielectric layer 246.

The third gate insulation layer 241 may be formed on the first silicon layer 101 in the NMOS region N in the third region III and on the third channel layer 113 in the PMOS region P in the third region III, and thus the third gate insulation layer 241 may be on the third region III of the substrate 100.

The third gate spacers 244 defining a third gate trench GT3 may be formed on the third gate insulation layer 241. The third high-k dielectric layer 246 may be formed along a sidewall and a bottom surface of the third gate trench GT3. The third gate electrode 242 and the third capping layer 243 may be sequentially formed on the third high-k dielectric layer 246 and may fill the third gate trench GT3.

Figure 18:
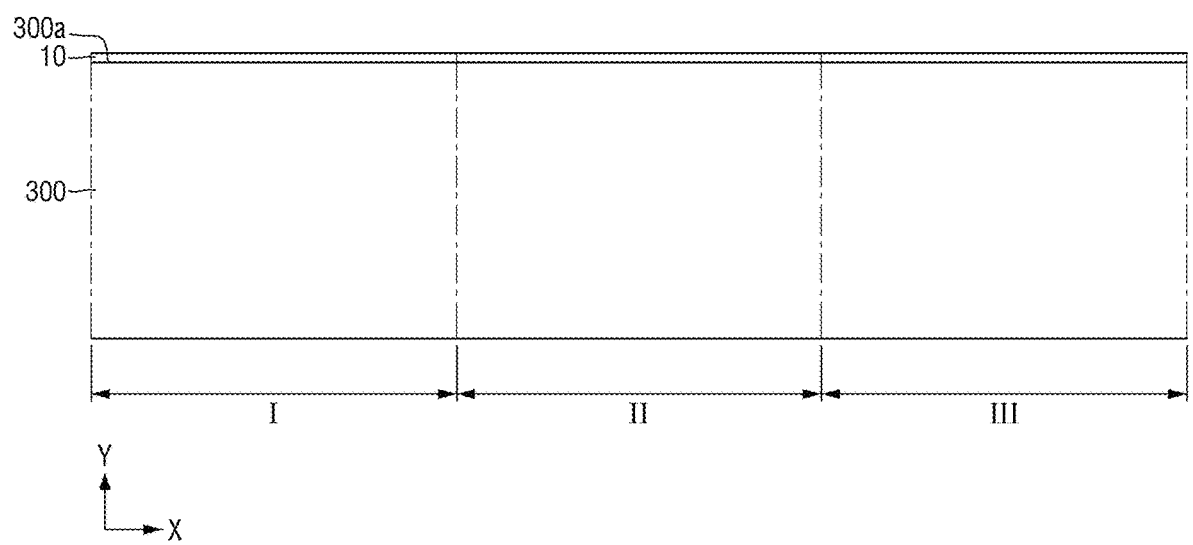
FIGS. 18 and 19 are views illustrating a method of manufacturing a semiconductor device according to some example embodiments of the inventive concepts.
Figure 19:
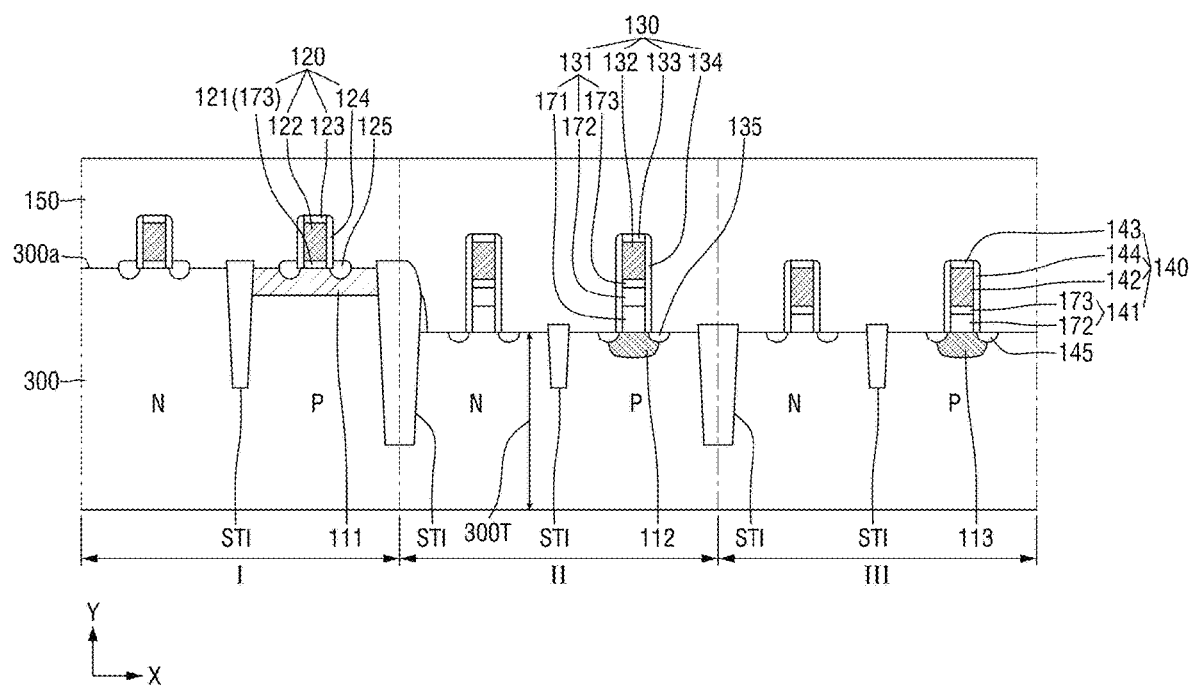

FIGS. 18 and 19 are views illustrating a method of manufacturing a semiconductor device according to some example embodiments of the inventive concepts. Differences between the method of manufacturing the semiconductor device as shown in FIGS. 1 to 16 and the method of manufacturing the semiconductor device of FIGS. 18 and 19 are mainly described.

Referring to FIGS. 18 and 19, the pad oxide layer 10 may be conformally formed on an upper surface 300a of a bulk silicon substrate 300.

Next, after similar processes as described with reference to FIGS. 3 to 16 are performed, the manufacturing process as shown in FIG. 1 may be performed to manufacture the semiconductor device of FIG. 19.

For example, an etched thickness 300T of each of the second region II and the third region III of the bulk silicon substrate 300 may be greater than 0 Å and equal to or less than about 100 Å, but the inventive concepts is not limited thereto. In some example embodiments, the process of etching each of the second region II and the third region III of the bulk silicon substrate 300 may be omitted. That is, respective upper surfaces 300a of the first to third regions I, II, and III of the bulk silicon substrate 300 may be coplanar with each other.

Figure 20:
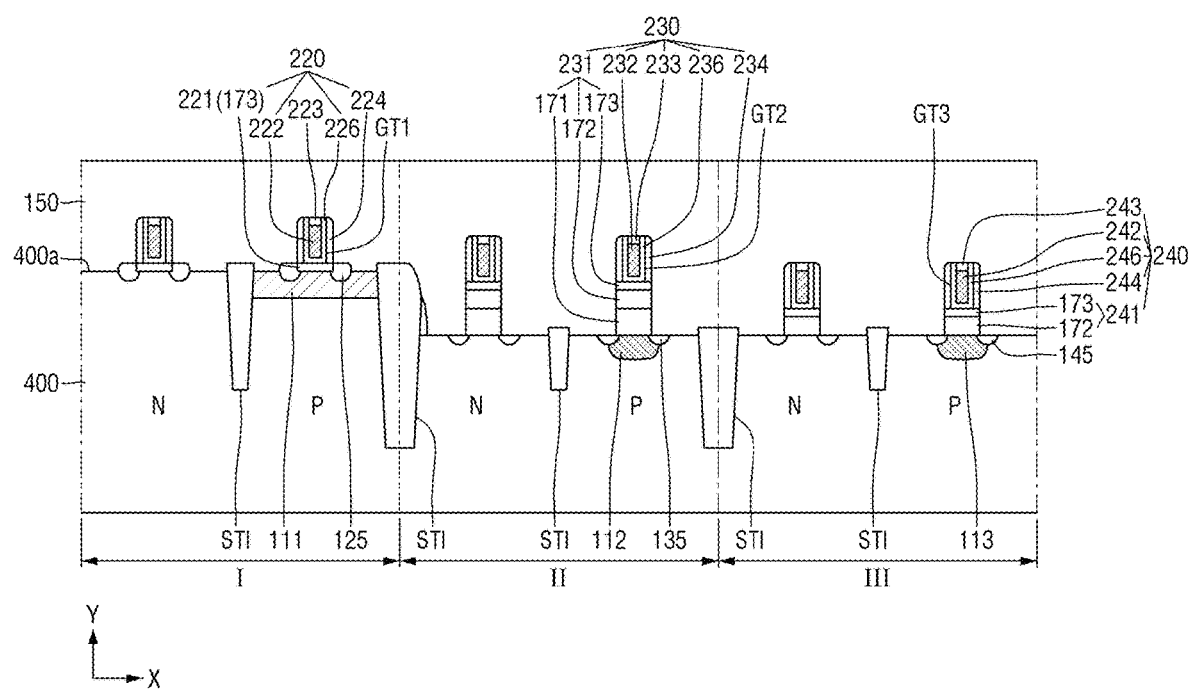
FIG. 20 is a view illustrating a semiconductor device according to some example embodiments of the inventive concepts.

FIG. 20 is a view illustrating a semiconductor device according to some example embodiments of the inventive concepts. Differences between the method of manufacturing the semiconductor device as shown in FIGS. 1 to 19 and a method of manufacturing a semiconductor device of FIG. 20 are mainly described.

Referring to FIG. 20, the pad oxide layer 10 (see FIG. 18) may be formed on an upper surface 400a of the substrate 400.

Next, after similar processes as described with reference to FIGS. 3 to 16 are performed, the process as shown in FIG. 17 may be performed to manufacture the semiconductor device of FIG. 20.

Figure 21:
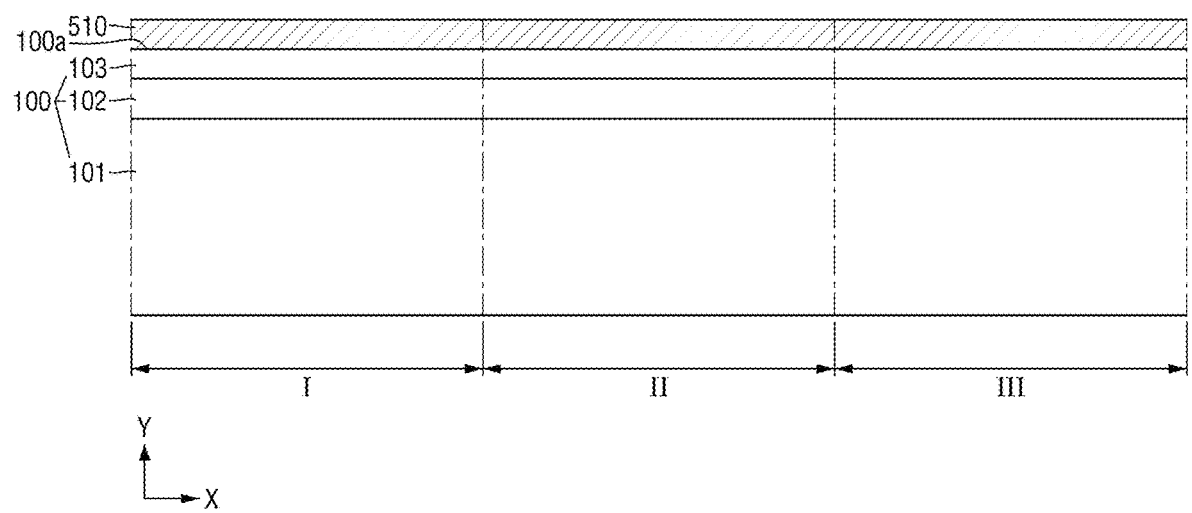
FIGS. 21, 22, and 23 are views illustrating a method of manufacturing a semiconductor device according to some example embodiments of the inventive concepts.
Figure 22:
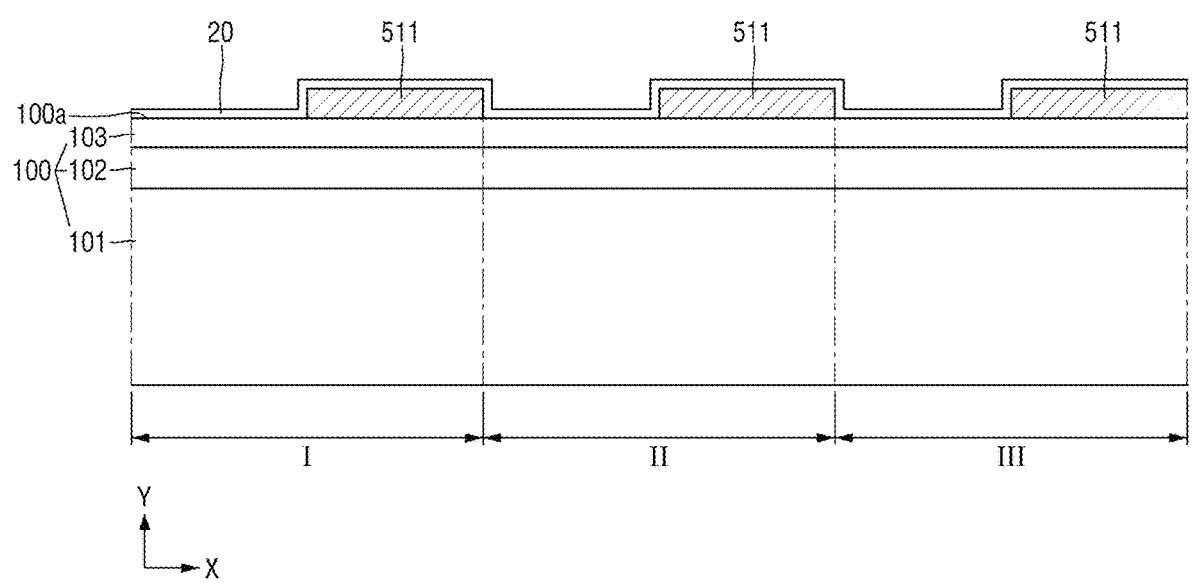
Figure 23:
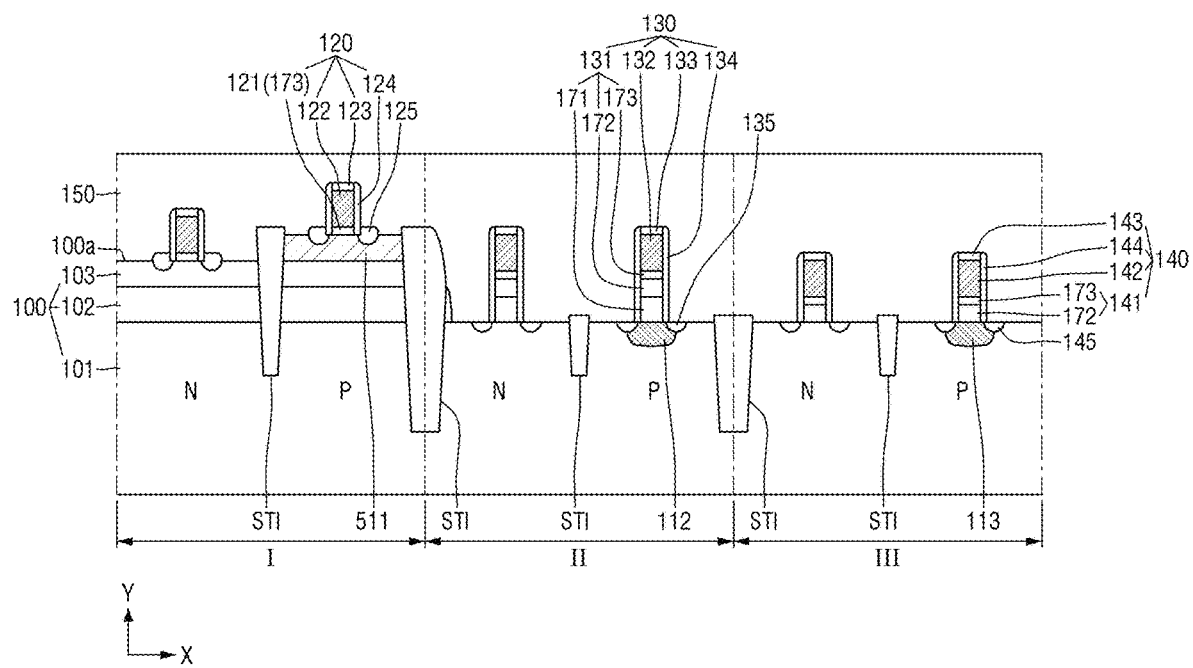

FIGS. 21, 22, and 23 are views illustrating a method of manufacturing a semiconductor device according to some example embodiments of the inventive concepts. Differences between the method of manufacturing the semiconductor device as shown in FIGS. 1 to 16 and a method of manufacturing a semiconductor device of FIGS. 21 to 23 are mainly described.

Referring to FIG. 21, the substrate 100 including the first silicon layer 101, the insulation layer 102, and the second silicon layer 103 that are sequentially stacked may be provided. A channel material layer 510 may be conformally formed on the upper surface 100a of the substrate 100.

The channel material layer 510 may be formed based on epitaxial growth on the substrate 100, using an upper surface of the second silicon layer 103 as a seed.

Referring to FIG. 22, the channel material layer 510 may be etched using a mask pattern formed on the channel material layer 510 as an etch mask to form a first channel layer 511 on the upper surface 100a of each of the first to third region I, II, and III of the substrate 100. Accordingly, it will be understood that forming the first channel layer 511 may include forming a channel material layer 510 on the substrate 100 and patterning the channel material layer 510 to form the first channel layer 511.

The capping oxide layer 20 may be conformally formed to cover the upper surface 100a of the substrate 100 and the first channel layer 511 that are exposed.

After the processes described with reference to FIGS. 7 to 16, the process as shown in FIG. 1 may be performed to manufacture the semiconductor device of FIG. 23.

Figure 24:
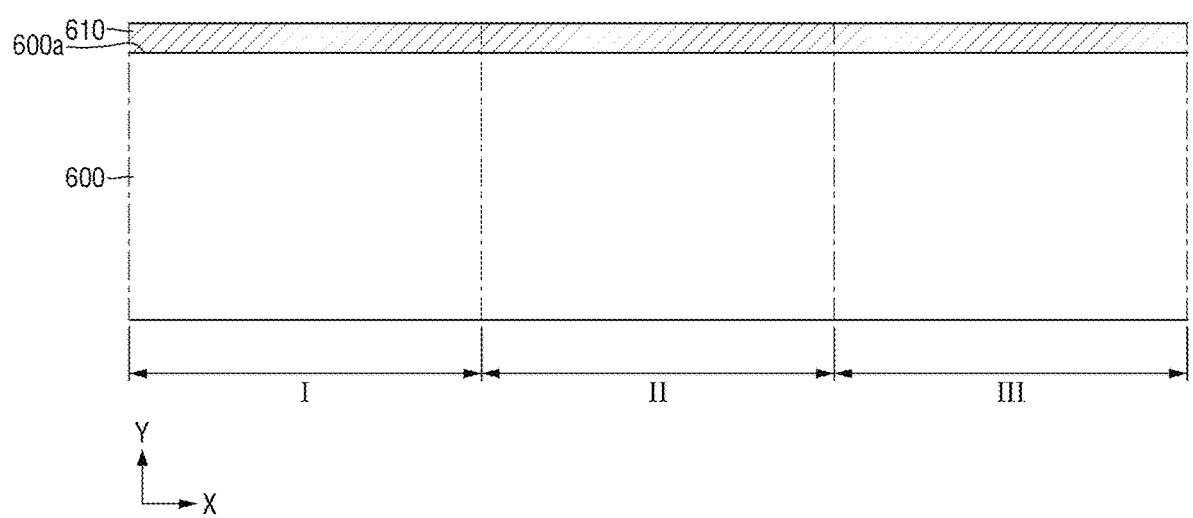
FIGS. 24, 25, and 26 are views illustrating a method of manufacturing a semiconductor device according to some example embodiments of the inventive concepts.
Figure 25:
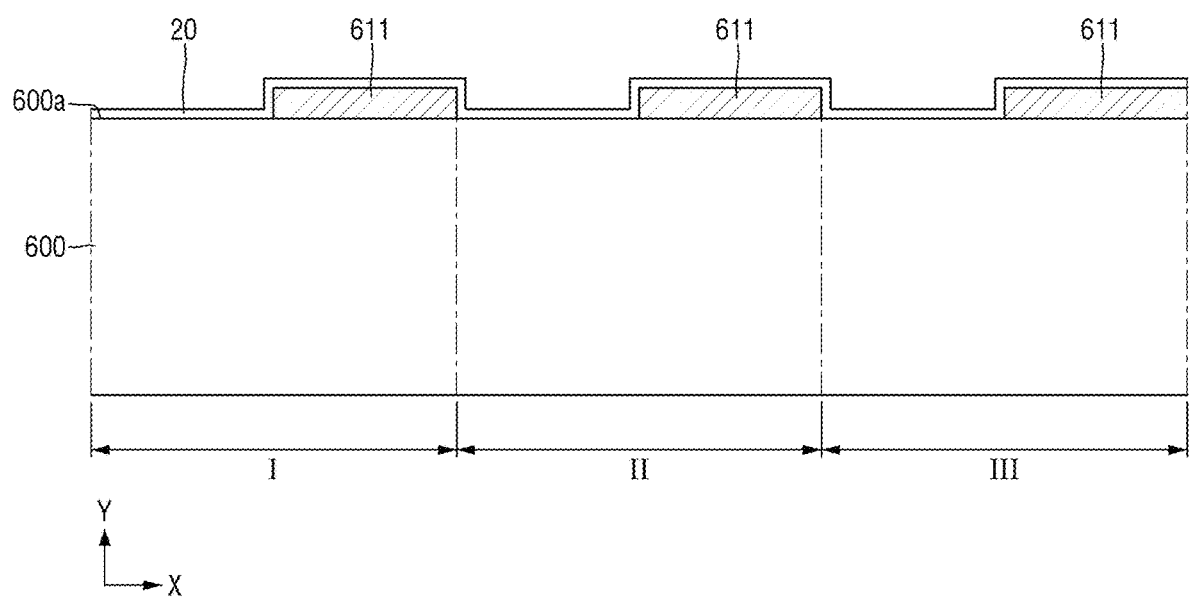
Figure 26:
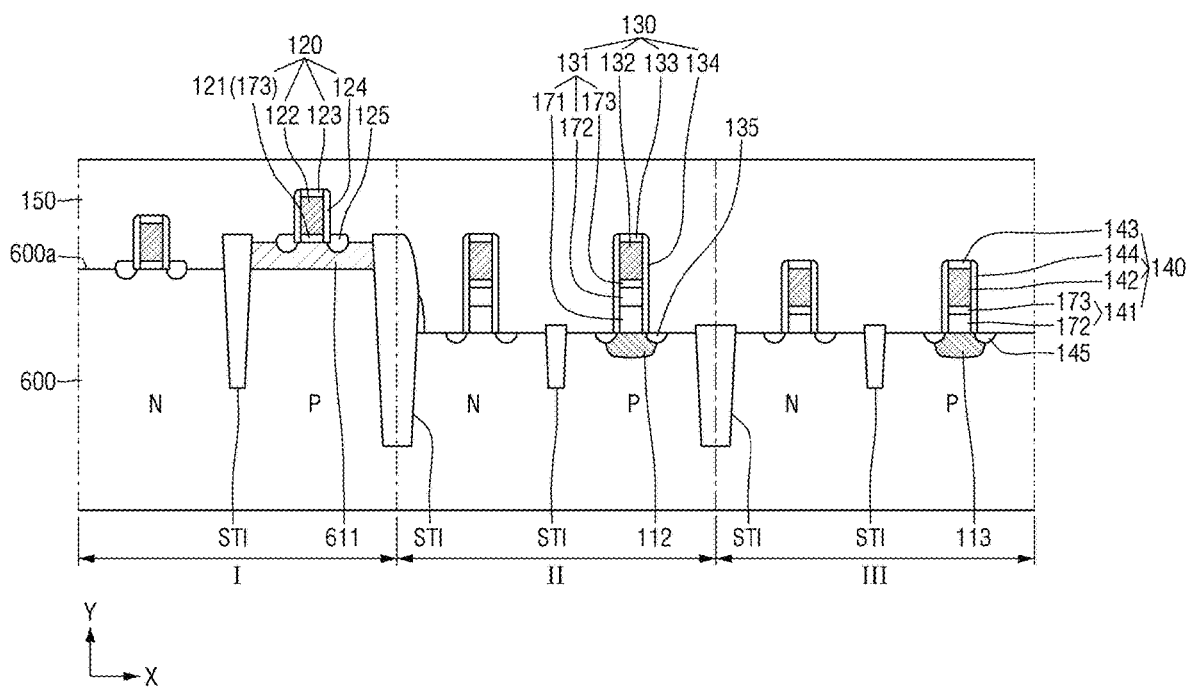

FIGS. 24, 25, and 26 are views illustrating a method of manufacturing a semiconductor device according to some example embodiments of the inventive concepts. Differences between the method of manufacturing the semiconductor device as shown in FIGS. 1 to 16 and a method of manufacturing a semiconductor device of FIGS. 24 to 26 are described.

Referring to FIG. 24, a channel material layer 610 may be conformally formed on an upper surface 600a of a bulk silicon substrate 600. The channel material layer 610 may be formed by epitaxial growth using an upper surface 600a of the bulk silicon substrate 600 as a seed.

Referring to FIG. 25, the channel material layer 610 may be etch using a mask pattern formed on the channel material layer 610 as an etch mask to form a first channel layer 611 on the upper surface 600a of each of the first to third region I, II, and III of the bulk silicon substrate 600.

The capping oxide layer 20 may be conformally formed to cover the upper surface 600a of the bulk silicon substrate 600 and the first channel layer 611 that are exposed.

After similar processes as described with reference to FIGS. 7 to 16 is performed, the process as shown in FIG. 1 may be performed to manufacture the semiconductor device of FIG. 26.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A method of manufacturing a semiconductor device, the method comprising:
   forming a first channel layer in a first region of a substrate, the substrate including the first region and a second region;
   forming an isolation region in the substrate to electrically isolate a portion of the first region from a portion of the second region;
   etching an upper surface of the second region of the substrate;
   forming a protection layer covering the first channel layer in the first region of the substrate and covering the second region of the substrate;
   removing the protection layer on the second region of the substrate;
   forming a gate insulation material layer on the protection layer and on the second region of the substrate; and
   removing the gate insulation material layer and the protection layer on the first region of the substrate.

2. The method according to claim 1, wherein forming the first channel layer comprises:
   forming a channel trench in the substrate; and
   forming the first channel layer in the channel trench.

3. The method according to claim 2, wherein the first channel layer is formed based on epitaxial growth in the channel trench.

4. The method according to claim 1, wherein forming the first channel layer comprises:
   forming a channel material layer on the substrate; and
   patterning the channel material layer to form the first channel layer.

5. The method according to claim 4, wherein the channel material layer is formed on the substrate based on epitaxial growth on the substrate.

6. The method according to claim 1, wherein the substrate includes a sequential stack of a first silicon layer, an insulation layer, and a second silicon layer.

7. The method according to claim 6, wherein the first channel layer is formed in the second silicon layer.

8. The method according to claim 7, wherein the first channel layer directly contacts the insulation layer.

9. The method according to claim 6, wherein
   a thickness of the insulation layer is in a range of about 100 Å to about 1000 Å, and
   a thickness of the second silicon layer is in a range of about 50 Å to about 500 Å.

10. The method according to claim 1, wherein the substrate is a bulk silicon substrate.

11. The method according to claim 10, wherein an etched thickness of the second region of the substrate is greater than 0 Å, and equal to or less than about 100 Å.

12. The method according to claim 1, wherein forming the gate insulation material layer comprises:
   forming a first oxide layer to cover the protection layer on the first region and to cover the upper surface of the second region of the substrate;
   removing the first oxide layer on the upper surface of the second region of the substrate; and
   forming a second oxide layer on the first oxide layer and on the second region of the substrate.

13. The method according to claim 12, wherein a thickness of the first oxide layer is greater than a thickness of the second oxide layer.

14. A method of manufacturing a semiconductor device, the method comprising:
   forming a first channel layer in a first region of a substrate, the substrate including the first region and a second region, the first channel layer including silicon germanium;
   etching an upper surface of the second region of the substrate;
   forming a protection layer covering the first channel layer in the first region of the substrate and covering the second region of the substrate;
   removing the protection layer on the second region of the substrate;
   forming a second channel layer in the second region of the substrate;
   forming a gate insulation material layer to cover the protection layer and on the second region of the substrate; and
   removing the gate insulation material layer and the protection layer on the first region of the substrate,
   wherein the substrate includes a sequential stack of a first silicon layer, an insulation layer, and a second silicon layer,
   wherein the first channel layer is formed in the second silicon layer.

15. The method according to claim 14, further comprising:

forming an isolation region in the substrate, subsequently to forming the first channel layer,
wherein the isolation region electrically isolates a portion of the first region from a portion of the second region.

16. The method according to claim 14, wherein forming the first channel layer comprises:
   forming a channel trench in the substrate; and
   forming the first channel layer based on epitaxial growth in the channel trench.

17. The method according to claim 14, wherein forming the gate insulation material layer comprises:
   forming a first oxide layer to cover the protection layer on the first region and cover the upper surface of the second region of the substrate;
   removing the first oxide layer on the upper surface of the second region of the substrate; and
   forming a second oxide layer on the first oxide layer and on the second region of the substrate.

\* \* \* \* \*